United States Patent
Sancon et al.

(10) Patent No.: US 12,223,995 B2
(45) Date of Patent: Feb. 11, 2025

(54) ADAPTIVE MEMORY REGISTERS

(71) Applicant: Micron Technology, Inc., Boise, ID (US)

(72) Inventors: John Christopher Sancon, Boise, ID (US); Kang-Yong Kim, Boise, ID (US); Yang Lu, Boise, ID (US); Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 17/823,407

(22) Filed: Aug. 30, 2022

(65) Prior Publication Data

US 2024/0071461 A1 Feb. 29, 2024

(51) Int. Cl.
*G11C 11/406* (2006.01)
*G11C 11/4096* (2006.01)

(52) U.S. Cl.
CPC .. *G11C 11/40622* (2013.01); *G11C 11/40615* (2013.01); *G11C 11/4096* (2013.01)

(58) Field of Classification Search
CPC .......... G11C 11/40622; G11C 11/4065; G11C 11/4096; G11C 11/40615
See application file for complete search history.

(56) References Cited

U.S. PATENT DOCUMENTS

| | | | | |
|---|---|---|---|---|
| 5,566,118 A | * | 10/1996 | Shimizu | G11C 11/406 365/230.03 |
| 7,272,066 B2 | * | 9/2007 | Klein | G11C 7/1006 365/230.09 |
| 9,418,723 B2 | * | 8/2016 | Chishti | G11C 11/4094 |
| 9,910,604 B2 | * | 3/2018 | Crawford | G06F 3/0673 |
| 2003/0007406 A1 | | 1/2003 | Kyung | |
| 2004/0156249 A1 | | 8/2004 | Kim | |
| 2005/0201174 A1 | | 9/2005 | Klein | |
| 2021/0318929 A1 | | 10/2021 | Guim Bernat et al. | |
| 2022/0229795 A1 | | 7/2022 | Cline et al. | |
| 2022/0230677 A1 | | 7/2022 | Yang et al. | |

(Continued)

OTHER PUBLICATIONS

"Restriction Requirement", U.S. Appl. No. 17/660,199, Dec. 22, 2023, 8 pages.

(Continued)

*Primary Examiner* — Son L Mai
(74) *Attorney, Agent, or Firm* — Colby Nipper PLLC

(57) ABSTRACT

Described apparatuses and methods relate to adaptive memory registers for a memory system that may support a nondeterministic protocol. To help manage power-delivery networks in a memory system, a device includes logic that can write values to memory registers associated with memory blocks of a memory array. The values indicate whether an associated memory block has been refreshed within a refresh interval. Other logic can read the registers to determine whether a block has been refreshed. The device also includes logic that can access data indicating a row address that was most recently, or is next to be, refreshed and write values representing the address to another register. The register can be read by other logic to determine whether a wordline potentially affected by an activation-based disturb event is near to being refreshed. These techniques can reduce the number of refresh operations performed, saving power and reducing costs.

55 Claims, 12 Drawing Sheets

(56) References Cited

U.S. PATENT DOCUMENTS

2023/0343380 A1 10/2023 Sancon et al.
2023/0343381 A1 10/2023 Sancon et al.

OTHER PUBLICATIONS

"Non-Final Office Action", U.S. Appl. No. 17/660,199, filed Jun. 13, 2024, 7 pages.
"Restriction Requirement", U.S. Appl. No. 17/660,201, filed Jun. 12, 2024, 6 pages.
"Non-Final Office Action", U.S. Appl. No. 17/660,201, filed Oct. 9, 2024, 14 pages.

* cited by examiner

900

Read from at least one memory register, by a logic circuit configured to be coupled to a memory device that includes multiple memory blocks, at least a portion of an address associated with the multiple memory blocks, the at least a portion of the row address corresponding to a refresh operation for a row of the multiple memory blocks
902

Determine a quantity of row addresses between the at least a portion of the address and another row address included on a list of row addresses related to activation-based refresh operations
904

Adjust the list of row addresses related to the activation-based refresh operations based on the quantity and a threshold value
906

*FIG. 9*

ADAPTIVE MEMORY REGISTERS

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and nonvolatile memory (e.g., flash memory). Like the number of cores or speed of a processor, the rate at which data can be accessed, and the delays in accessing it, can impact an electronic device's performance. This impact on performance increases as processors are developed that execute code faster and as applications on electronic devices operate on ever-larger data sets that require ever-larger memories.

BRIEF DESCRIPTION OF THE DRAWINGS

Apparatuses of and techniques for adaptive memory registers are described with reference to the following drawings. The same numbers are used throughout the drawings to reference like features and components:

FIG. 6-1 illustrates a portion of another example memory system that can implement aspects of adaptive memory registers;

FIG. 6-2 illustrates example memory registers of the other example memory system of FIG. 6-1 that can implement aspects of adaptive memory registers;

FIG. 7-1 illustrates a portion of another example memory system that can implement other aspects of adaptive memory registers;

FIG. 7-2 illustrates example memory registers of the other example memory system 7-1 that can implement aspects of adaptive memory registers;

FIG. 7-3 illustrates a flow diagram for an example process that can be used to implement aspects of adaptive memory registers; and FIG. 8 and FIG. 9 illustrate flow diagrams for example processes that can implement aspects of adaptive memory registers.

DETAILED DESCRIPTION

Overview

Figure 1:
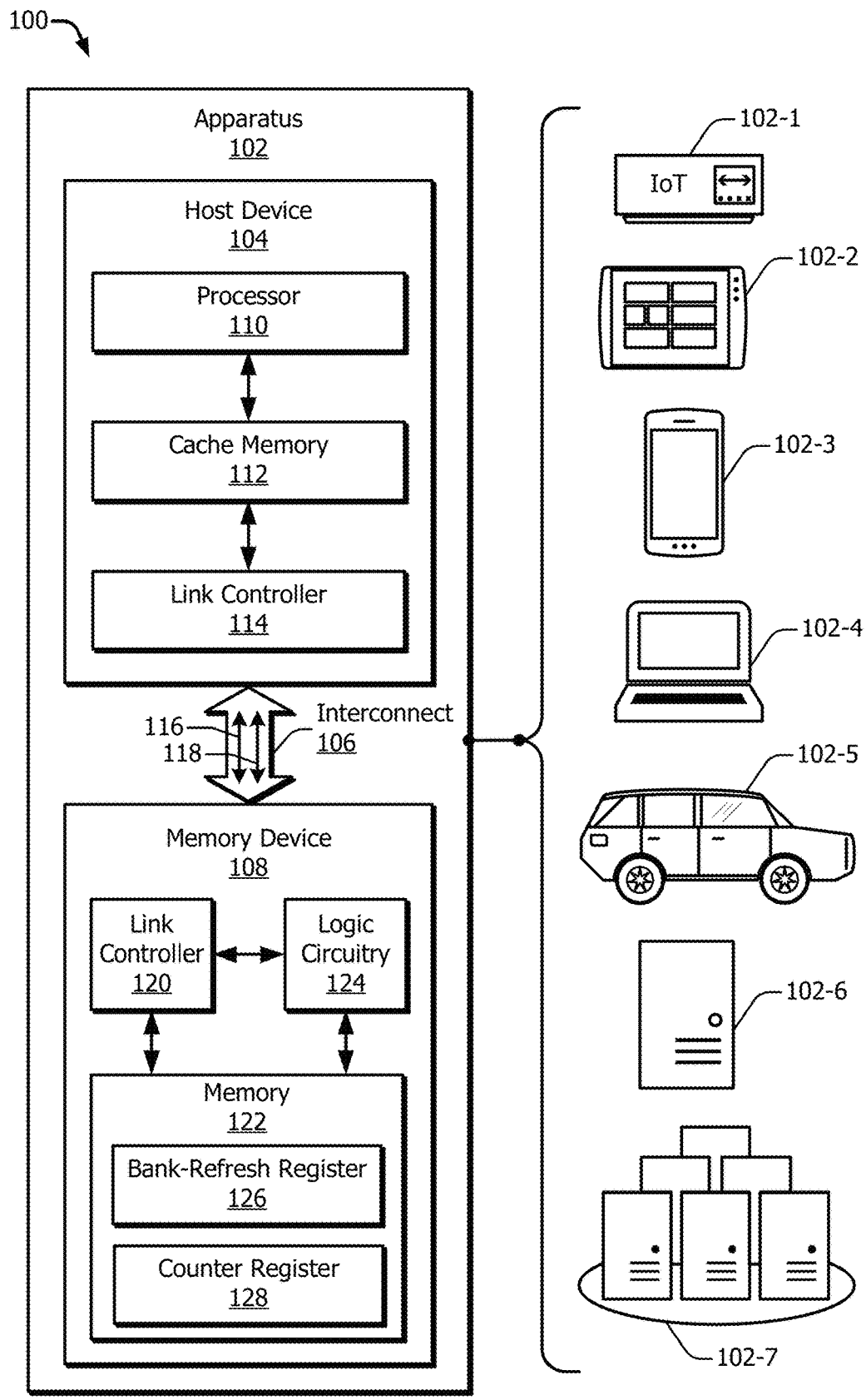
FIG. 1 illustrates example apparatuses that can implement adaptive memory registers.

Processors and memory work in tandem to provide features on computers and other electronic devices, including smartphones. An electronic device can generally provide enhanced features, such as high-resolution graphics and artificial intelligence, as a processor-and-memory tandem operate faster. Some applications, like those for artificial intelligence and virtual-reality graphics, demand increasing amounts of memory. Advances in processors have often outpaced those for memories or the connections between the processor and memory.

Processors and memories can be secured to a printed circuit board (PCB), such as a motherboard. The PCB can include sockets for accepting at least one processor and one or more memories and various wiring infrastructure that enable communication between two or more components. The PCB, however, offers a finite area for the sockets and the wiring infrastructure. Some PCBs include sockets that are shaped into linear slots and are designed to accept multiple double-inline memory modules (DIMMs). These sockets can be fully occupied by DIMMs while a processor is still able to utilize more memory. In such situations, the system can have improved performance if more memory were available.

Printed circuit boards may also include at least one peripheral component interconnect (PCI) express (PCI Express®) (PCIe) slot. PCIe is designed to provide a common interface for various types of components that may be coupled to a PCB. Compared to some older standards, PCIe can provide higher rates of data transfer or a smaller footprint on the PCB, including both greater speed and smaller size. PCIe links enable interconnection of processors and peripheral memory devices at increased speeds compared to older standards. Accordingly, some PCBs enable a processor to access a memory device that is connected to the PCB via a PCIe slot.

PCIe links, however, have limitations in an environment with large, shared memory pools and devices that require high bandwidth and low latency. For example, PCIe links do not specify mechanisms to support coherency and often cannot efficiently manage isolated pools of memory. In addition, the latency for PCIe links can be too high to efficiently manage shared memory access across multiple devices within a system.

As a result, accessing a memory solely using a PCIe protocol may not offer as much functionality, flexibility, or reliability as is desired. In such cases, another protocol can be layered on top of the PCIe protocol. An example of another, higher-level protocol is the Compute Express Link (CXL) protocol or standard (referred to hereinafter as "the CXL protocol" or "the CXL standard"). The CXL protocol can be implemented over a physical layer that is governed by, for instance, the PCIe protocol. The CXL protocol targets intensive workloads for processors and memory devices (e.g., accelerators, memory expanders), where efficient, coherent memory access or interactions between processors and memory is beneficial.

The CXL protocol addresses some of the limitations of PCIe links by providing an interface that leverages the PCIe 5.0 physical layer and electricals, while providing lower-latency paths for memory access and coherent caching between processors and memory devices. It offers high-bandwidth, low-latency connectivity between host devices (e.g., processors, CPUs, SoCs) and memory devices (e.g., accelerators, memory expenders, memory buffers, smart input/output (I/O) devices). The CXL protocol also addresses growing high-performance computational workloads by supporting heterogeneous processing and memory systems with potential applications in artificial intelligence, machine learning, communication systems, and other high-performance computing.

Various electronic devices, such as a mobile phone with a system-on-chip (SoC) or a cloud-computing server with dozens of processing units, may employ memory that is coupled to a processor via a CXL-based interconnect (which can be referred to as a "CXL link" in this document). For clarity, consider an apparatus with a host device that is coupled to a memory device via a CXL link. The host device can include a processor and a controller (e.g., a host-side controller) that is coupled to the interconnect. The memory device can include another controller (e.g., a memory-side controller) that is coupled to the interconnect and one or more memory arrays to store information in static RAM (SRAM), dynamic RAM (DRAM), flash memory, and so forth.

While the CXL protocol can help address the issue of the higher latency of PCIe links, using CXL can also lead to challenges related to power consumption when used with some types of memory. For example, volatile memory, including double data rate synchronous dynamic random-access memory (DDR SDRAM) and low-power DDR (LPDDR), is made in part from capacitors, from which the charge slowly drains over time. Data stored in memory cells of volatile memory may be lost if the capacitor is not recharged. Therefore, to maintain an appropriate charge, the memory cells are periodically refreshed.

To perform a refresh operation, the memory reads data from a memory cell corresponding to a refresh address into a temporary storage (e.g., a sense amp) and then writes the data back to the memory cell with the proper charge. A refresh address can include, for example, one or more of memory cell addresses, row addresses, or bank addresses. Refresh operations may be initiated and controlled by a memory controller or other logic that is external to a chip or die including the memory component (e.g., using an auto-refresh command issued by the memory controller) or by logic that is internal to the memory chip or die (e.g., using a self-refresh operation controlled by the logic). A self-refresh operation may further involve deactivating an internal clock to reduce power consumption and executing a refresh operation by using an internal refresh counter.

Generally, each memory cell in a volatile memory is refreshed at least once within a given refresh interval to maintain the integrity of stored data (e.g., a refresh interval of approximately 32 milliseconds or approximately 64 milliseconds). The logic may therefore issue a refresh command that corresponds to or includes one all-bank refresh command (sometimes called, for example, ABR or REFab) or multiple per-bank refresh commands (e.g., PBR or REFpb), depending on the bank configuration. The memory controller can issue the refresh command(s) at a frequency sufficient to refresh each memory cell of a given memory array within the relevant refresh interval. When the memory is in a power-saving mode (e.g., a self-refresh mode), the memory can perform the self-refresh operations at a similar rate or frequency, using the internal clock or counter.

Refresh operations can, however, present challenges of their own. For example, refresh operations can consume relatively large amounts of power. During a refresh operation, multiple wordlines per bank can be activated at approximately the same time in order to refresh the entire memory array (e.g. all of the banks of a DRAM device) within the refresh interval. As noted, the duration of the refresh interval is determined so that the cells of the memory array are refreshed often enough to maintain performance and data-integrity metrics (e.g., as defined in a specification such as a Joint Electron Device Engineering Council (JEDEC) standard). Activating a wordline is part of the refresh operation for the row served by the wordline. The activation causes an electric current peak. The larger the page size (e.g., row size and/or density), the higher the peak current will be.

This effect can be more pronounced with volatile memory (e.g., DRAM) for use with CXL devices. The page size may be similar to the higher end of typical memory page sizes (e.g., 2.25 KB), but because of other factors (e.g., higher density, larger die sizes, refresh timing requirements, data-retention requirements), volatile memory used with CXL devices often refresh more wordlines per bank at one time (e.g., eight or more wordlines at a time). This can bring the total page size closer to 18 KB, which means the peak current can be between nearly three and nine times higher with CXL devices. The higher peak current can make designing the local power delivery network (PDN) more complex and increase the cost of the PDN (e.g., more metal layers, capacitors). Further, while there may be some solutions that can help reduce overall peak current (e.g., at the die or module level), those techniques may not reduce peak current at the local bank level.

In some refresh operations, particular row addresses/wordlines may be refreshed for multiple banks at the same time (or nearly the same time). In these cases there is logic, such as a memory controller, that keeps track of the banks that have been refreshed through a particular row or wordline. In some circumstances, the logic may lose track of which banks have already been refreshed using REFpb. For example, if the REFpb operations have been completed through a given wordline for bank 0 through bank 2 and the operations are interrupted, the logic may not have the ability to resume refresh operations for that wordline at bank 3. In this situation, the logic may start over, which can consume unnecessary power and increase the risk of lost data. To address this, the logic can use a REFab command, which will refresh all the banks. While this technique can ensure that all the banks are refreshed, it uses power to refresh banks that may not need to be refreshed and introduces the current peaks that can increase costs. Additionally, memory controllers or other control logic do not typically include a mechanism to track the bank refresh status when the memory device exits the self-refresh (power-saving) mode. This issue can again be addressed using the ABR command, with similar downsides.

In either case (losing track of the per bank refresh or exiting self-refresh), some kinds of memory (e.g., low-cost high-density synchronous DRAM) and associated modules may not support all-bank refresh because it can increase cost and power draw. To increase density and lower cost, for example, the area occupied by the cells can be increased and the amount of area occupied by periphery decreased (e.g., increase array efficiency). This configuration can come with some restrictions. For example, supporting REFab may require additional periphery, such as power routing and components in the die so that the power distribution network (PDN) can support simultaneous operations on the banks required by the REFab command. These additional components can add cost and reduce array efficiency.

Further, power consumption is generally related to capacitance. Thus, when density is increased, so is capacitance, which increases power consumption. For example, at the beginning of the charging phase (as part of refresh/self-refresh operations), increased capacitance can lead to higher peak power consumption. One way to mitigate this increased power consumption is by not supporting simultaneous bank operations like the REFab. In this case, without REFab, the logic can still lose track of the last bank refreshed (and still not have access to the last bank refreshed after the memory device exits self-refresh). Thus, tracking which banks have been refreshed becomes more important.

Another challenge that the refresh process presents is related to a concept sometimes referred to as a usage-based (or activation-based) disturb (or disturbance) effect. A usage-based disturb is an effect on memory cells adjacent to cells being refreshed (e.g., to cells of a row/wordline adjunct to the row/wordline being refreshed). Because of the electrical interactions between memory cells, especially at higher densities, if a row N is repeatedly refreshed (or activated or charged) then the charges of cells in adjacent rows (e.g., N+1, N+2, N−1, N−2) can degrade. Thus, the adjacent rows can be susceptible to this effect, or in cases where the repeated refresh is intentional, an "attack."

The so-called "affected row" is not being accessed or refreshed, but if a malicious actor learns the row location of information the actor wants to corrupt, the actor can focus on one or two or three wordlines and activates and pre-charges those two or three wordlines repeatedly and hopes that the content of the adjacent cells in the affected row, become corrupted. When the cells of the adjacent rows contain, for example, security keys, then the attacker may get access to locations in the memory that are supposed to be secure. Generally, refresh management does not account for the affected rows of a usage-based disturb. Rather than refreshing an affected row before it is corrupted, which could preserve the data, refresh operations are based on the clock or counter functions, as described above.

To improve performance of a memory system, including, for example, a C×L system, this document describes example approaches that can be used to implement the adaptive row counter adaptive memory registers. Consider, for example, a memory array of a memory device (e.g., a DRAM device or chip) memory that includes logic circuitry that can write values to one or more entries of a memory register (e.g., bits of a mode register). Each entry can be associated with different memory blocks of a memory array, such as banks of a DRAM device. The values can indicate whether the associated memory block has been refreshed within a current refresh interval (e.g., the values can be considered a refresh flag that indicates a refresh status). For example, as a refresh operation is executed, the logic can write a "1" to an entry after the associated bank (or a row of a bank) is refreshed. When all of the banks have been refreshed within the refresh interval, the logic can write "0" to all of the entries so that when the next refresh interval begins, all of the blocks are to be refreshed.

In this example implementation of the adaptive row counter adaptive memory registers, other logic can be included with a processor, such as a memory controller that is coupled to the memory blocks of the memory device. This other logic can be used to determine that at least some of the blocks are to be refreshed during the current refresh interval. For example, the other logic can read the values from the memory registers associated with the memory blocks (e.g., banks) of the array. Based on the values (e.g., "1" or "0" as described above), the logic can determine which blocks or banks have not been refreshed within the current refresh interval. Then, the logic can transmit a signal that indicates which block or bank is to be refreshed when the next refresh command is issued.

In another example implementation, a memory array of a memory device (e.g., a DRAM device or chip) memory can include logic that can be used to transmit bits from a refresh counter included with the memory device to a memory register. The bits represent at least a portion of an address that indicates a row of the memory array that is to be refreshed. For example, based on operation of the row counter, which increments as rows are refreshed, the logic can transmit bits that represent the address of the most-recently refreshed row, the row for which refresh operations are in-progress, or the row that will be refreshed next.

This example implementation can include other logic with a processor, such as a memory controller that is coupled to the memory blocks of the memory device. The other logic can be used to read the memory register. The other logic can also have access to a list of row addresses related to activation-based refresh operations (e.g., addresses of suspected affected rows of a usage-based disturb). For example, the list may include addresses that may need to be refreshed outside of a typical schedule to mitigate the effects of a usage-based disturb.

Using the values of the bits in the register, and the list of row addresses related to activation-based refresh operations, the logic can determine how many row addresses are between the row represented by the bits in the register and another row address that is on the list. Once the quantity of rows between the addresses is determined, the logic can adjust the list, based on the quantity and a threshold value. For example, the logic can be used to prioritize refresh operations for suspected affected rows of the usage-based disturb (or other instances of this kind of effect) or to determine that the standard refresh schedule will be adequate to account for the effects of any suspected usage-based disturb.

By employing one or more of these implementations, peak power consumption (e.g., peak current draw) at the bank (local) level can be reduced. This can make it easier to meet refresh timing and memory retention targets in higher density memory. Further, reducing the peak current can reduce the requirements for metal layers and other components in the local PDN, which can reduce cost. Reducing the peak current can also reduce the system-level peak current, making system-level PDN design less complex.

For example, using memory registers to store information related to which banks have been or still need to be refreshed for a current refresh interval (or after self-refresh exit), can reduce peak current draw and save cost on power distribution network in the die and on the module PCB (e.g., system-level). Because the logic can determine the correct row(s) to begin refresh operations, the overall number of refresh operations, and therefore the amount of power used, can be reduced. Further, avoiding the "all bank" refresh can also reduce peak current draw, which can result in lower PDN costs.

Similarly, using memory registers to keep track of rows that may be affected by a usage-based disturb can reduce power consumption by avoiding performing "extra" refresh operations on a suspected affected row. For example, if the memory controller (or other logic) determines that an address on the list of row addresses related to activation-based refresh operations should be refreshed to avoid possible data corruption from a usage-based disturb, the row may be refreshed outside of a regularly scheduled refresh operation. This requires power consumption and may increase peak current levels. By using the described techniques, the logic can determine that the suspected affected row will be refreshed by the regular refresh operations within a time that will still mitigate the usage-based disturb effects. Thus, the suspect row can be de-prioritized, and an "extra" refresh operation can be avoided.

Further, being able to determine what rows are on the list of row addresses related to activation-based refresh operations and when those rows will be refreshed in the normal course of operations can also create another avenue for the development of additional mitigation algorithms to address the usage-based disturb.

Example Operating Environments

FIG. 1 illustrates, at 100 generally, an example apparatus 102 that can implement aspects of adaptive memory registers. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure or a data center or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a link controller 114. The memory device 108, which can also be a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the link controller 114. The processor 110 is also coupled, directly or indirectly, to the link controller 114. The host device 104 may include other components to form, for instance, a system-on-a-chip (SoC). The processor 110 may include a general-purpose processor, central processing unit (CPU), graphics processing unit (GPU), neural network engine or accelerator, application-specific integrated circuit (ASIC), field-programmable gate array (FPGA) integrated circuit (IC), or communications processor (e.g., a modem or baseband processor).

In operation, the link controller 114 can provide a high-level or logical interface between the processor 110 and at least one memory (e.g., an external memory). The link controller 114 can, for example, receive memory requests from the processor 110 and provide the memory requests to external memory with appropriate formatting, timing, and reordering. The link controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus, switching fabric, or one or more wires that carry voltage or current signals.

The interconnect 106 can include at least one command and address bus 116 (CA bus 116) and at least one data bus 118 (DQ bus 118). Each bus may be a unidirectional or a bidirectional bus. The CA bus 116 and the DQ bus 118 may couple to CA and DQ pins, respectively, of the memory device 108. In some implementations, the interconnect 106 may also include a chip-select (CS) I/O (not illustrated in FIG. 1) that can, for example, couple to one or more CS pins of the memory device 108. The interconnect 106 may also include a clock bus (CK bus—not illustrated in FIG. 1) that is part of or separate from the CA bus 116.

The interconnect 106 can be a CXL link. In other words, the interconnect 106 can comport with at least one CXL standard or protocol. The CXL link can provide an interface on top of the physical layer and electricals of the PCIe 5.0 physical layer. The CXL link can cause requests to and responses from the memory device 108 to be packaged as flits. An example implementation of the apparatus 102 with a CXL link is discussed in greater detail with respect to FIG. 4. In other implementations, the interconnect 106 can be another type of link, including a PCIe 5.0 link. In this document, some terminology may draw from one or more of these standards or versions thereof, like the CXL standard, for clarity. The described principles, however, are also applicable to memories and systems that comport with other standards and interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the link controller 114. A memory (e.g., the memory device 108) may have an "internal" or "local" cache memory. As another example, the apparatus 102 may include cache memory between the interconnect 106 and the memory device 108. Computer engineers can also include the illustrated components in distributed or shared memory systems.

Computer engineers may implement the host device 104 and the various memories in multiple manners. In some cases, the host device 104 and the memory device 108 can be disposed on, or physically supported by, a PCB (e.g., a rigid or flexible motherboard). The host device 104 and the memory device 108 may additionally be integrated on an IC or fabricated on separate ICs packaged together. The memory device 108 may also be coupled to multiple host devices 104 via one or more interconnects 106 and may respond to memory requests from two or more host devices 104. Each host device 104 may include a respective link controller 114, or the multiple host devices 104 may share a link controller 114. This document describes an example computing system architecture with at least one host device 104 coupled to the memory device 108 with reference to FIG. 2.

Two or more memory components (e.g., modules, dies, banks, bank groups, or ranks) can share the electrical paths or couplings of the interconnect 106. In some implementations, the CA bus 116 transmits addresses and commands from the link controller 114 to the memory device 108, which may exclude propagating data. The DQ bus 118 can propagate data between the link controller 114 and the memory device 108. The memory device 108 can also include a link controller 120 that is similar to the link controller 114 of the host device 104. The link controllers 114 and 120 can, for example, package and unpackage requests and responses in the appropriate format (e.g., as a flit) for transmission over the interconnect 106. The memory device 108 includes memory 122, which may include multiple memory blocks, arrays, and/or banks (not illustrated in FIG. 1). The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or an SoC of the apparatus 102. In some implementations, the memory device 108 can include logic circuitry 124, a bank-refresh indication register (bank-refresh register) 126, or a row-counter register (counter register) 128, which can be used to implement adaptive memory registers, which can reduce peak power draw during refresh operations and mitigate the effects of a usage-based disturb (or disturbance), as described in more detail with reference to FIGS. 2-9.

The logic circuitry 124 can write values to either or both of the bank-refresh register 126 or the counter register 128. For example, the logic circuitry 124 can write values or bits to entries of the bank-refresh register 126, which indicate which memory blocks of the memory 122 have been refreshed within a current refresh interval. The logic circuitry 124 can also or instead write values or bits to the counter register 128, which represent an address (or addresses) of a row of the memory 122 that is to be refreshed. For example, based on operations of a row counter (not shown) associated with the memory 122, which increments as rows are refreshed, the logic circuitry 124 can transmit bits that represent the address of the most-recently refreshed row, the row for which refresh operations are in-progress, or the row that will be refreshed next.

As shown in FIG. 1, the logic circuitry 124 can be integrated with the memory device 108. In other cases (not shown), the logic circuitry 124 may be included with a memory controller (not shown) that is associated with the memory device 108. In other cases (not shown in FIG. 1), the logic circuitry 124 can be independent of the memory device 108 or associated with another component of the apparatus 102, such as the host device 104. In some implementations, the logic circuitry 124 may be a single circuit (as shown). In other implementations (not shown) the logic circuitry 124 may be implemented as multiple circuits (e.g., one to write the values or bits to the bank-refresh register 126 and another to write to the counter register 128).

As shown in FIG. 1, the bank-refresh register 126 and the counter register 128 are included in the block representing the memory 122. For example, either or both of the bank-refresh register 126 or the counter register 128 may be realized as mode registers for the memory 122. In some implementations, however (not shown), one or both of the bank-refresh register 126 or the counter register 128 may be realized separate from the memory 122 (e.g., integrated as, or with, another component of the memory device 108).

Figure 2:
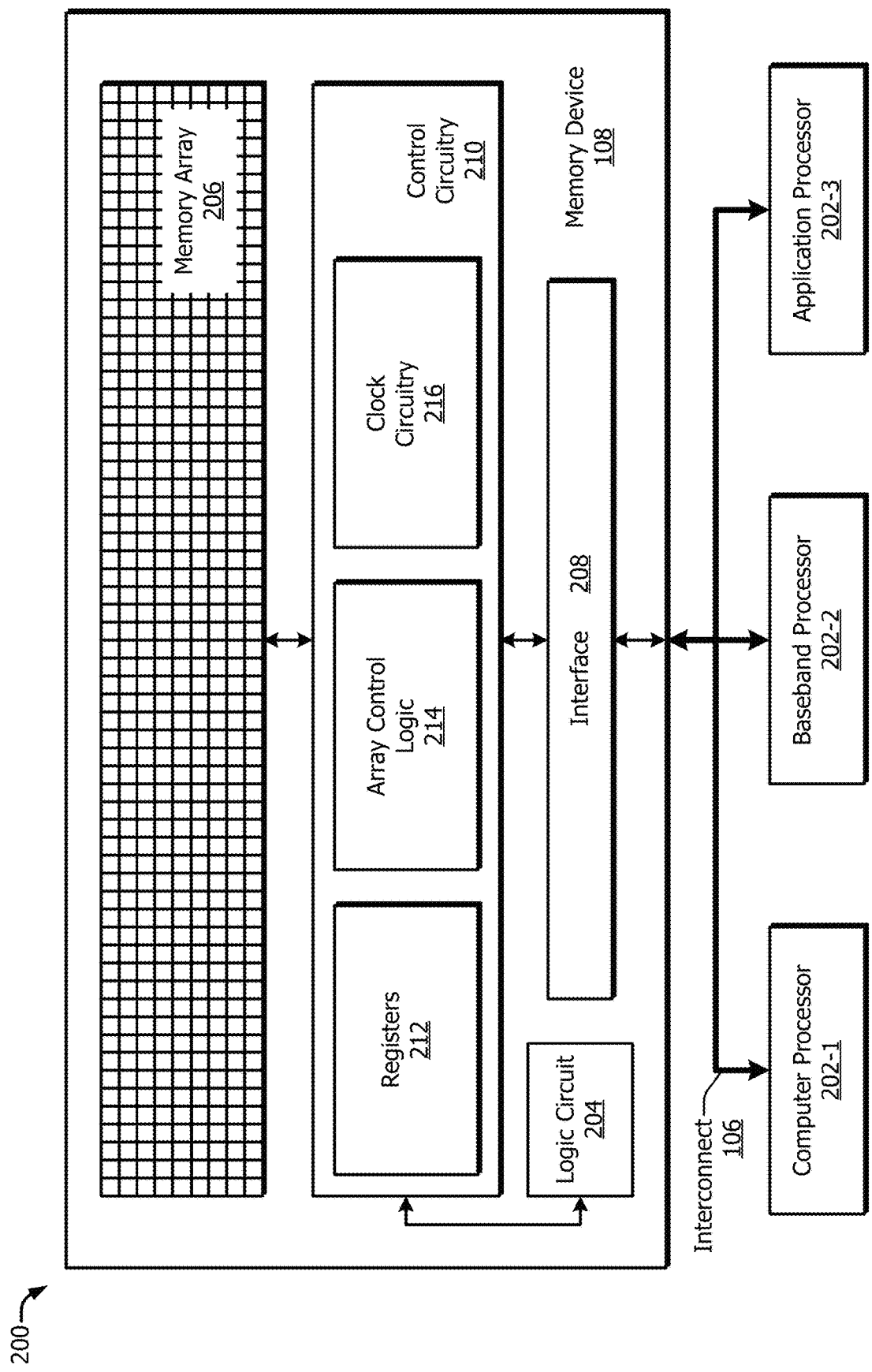
FIG. 2 illustrates an example computing system that can implement aspects of adaptive memory registers with a memory device.

FIG. 2 illustrates an example computing system 200 that can implement aspects of adaptive memory registers with a memory device. In some implementations, the computing system 200 includes at least one memory device 108, at least one interconnect 106, and at least one processor 202. In the illustrated implementation, the memory device 108 also includes a logic circuit 204.

The memory device 108 can include, or be associated with, at least one memory array 206, at least one interface 208, and control circuitry 210 operatively coupled to the memory array 206. The memory device 108 can correspond to one or more of the cache memory, the main memory, or a storage memory of the apparatus 102 of FIG. 1. Thus, the memory array 206 can include an array of memory cells, including but not limited to memory cells of DRAM, SDRAM, 3D-stacked DRAM, DDR memory, low-power DRAM, or LPDDR SDRAM. For example, the memory array 206 can include memory cells of SDRAM configured as a memory module with one channel containing either 16 or 8 data (DQ) signals, double-data-rate input/output (I/O) signaling, and supporting a supply voltage of 0.3 to 0.5V. The density of the memory device 108 can range, for instance, from 2 Gb to 32 Gb. The memory array 206 and the control circuitry 210 may be components on a single semiconductor die or on separate semiconductor dies. The memory array 206 or the control circuitry 210 may also be distributed across multiple dies.

The control circuitry 210 can include various components that the memory device 108 can use to perform various operations. These operations can include communicating with other devices, managing memory performance, and performing memory read or write operations. For example, the control circuitry 210 can include one or more registers 212, at least one instance of array control logic 214, and clock circuitry 216. The registers 212 may be implemented, for example, as one or more registers (e.g., a masked-write enablement register) that can store information to be used by the control circuitry 210 or another part of the memory device 108. The array control logic 214 can be circuitry that provides command decoding, address decoding, input/output functions, amplification circuitry, power supply management, power control modes, and other functions. The clock circuitry 216 can synchronize various memory components with one or more external clock signals provided over the interconnect 106, including a command/address clock or a data clock. The clock circuitry 216 can also use an internal clock signal to synchronize memory components.

In the illustrated implementation, the logic circuit 204 is included as a separate component of the memory device 108 and connected to the control circuitry 210. In other implementations, the logic circuit 204 may connect to other or additional components directly (e.g., to the interface 208, to the memory array 206). Additionally or alternatively, the logic circuit 204 may be incorporated in or at another component of the memory device 108, such as the control circuitry 210. As described with respect to the logic circuitry 124, the logic circuit 204 can be used to write values to either or both of the bank-refresh register 126 or the counter register 128. For example, the registers 212 may include or be associated with either or both of the bank-refresh register 126 or the counter register 128 and the logic circuit 204 can write values to the registers 212 to reduce peak power draw during the refresh operations and improve mitigation management for usage-based disturb effects, as described in more detail with reference to FIGS. 2-9. Reducing power consumption allows memory designers and engineers to make tradeoffs between power distribution network limitations and overall memory latency, which can enable solutions for different customers and product-design parameters.

The interface 208 can couple the control circuitry 210 or the memory array 206 directly or indirectly to the interconnect 106. As shown in FIG. 2, the registers 212, the array control logic 214, and the clock circuitry 216 can be part of a single component (e.g., the control circuitry 210). In other implementations, one or more of the registers 212, the array control logic 214, or the clock circuitry 216 may be separate components on a single semiconductor die or across multiple semiconductor dies. These components may individually or jointly couple to the interconnect 106 via the interface 208.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a CA bus 116 and a DQ bus 118 (as illustrated in FIG. 1). As discussed above with respect to FIG. 1, the interconnect 106 can be a CXL link or comport with at least one CXL standard. The CXL link can provide an interface on top of the physical layer and electricals of the PCIe 5.0 physical layer.

In some aspects, the memory device 108 may be a "separate" component relative to the host device 104 (of FIG. 1) or any of the processors 202. The separate components can include a PCB, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a PCB or in a single package or an SoC.

The designed apparatuses and methods may be appropriate for memory designed for lower-power operations or energy-efficient applications. An example of a memory standard related to low-power applications is the LPDDR standard for SDRAM as promulgated by the JEDEC Solid State Technology Association. In this document, some terminology may draw from one or more of these standards or versions thereof, like the LPDDR5 standard, for clarity. The described principles, however, are also applicable to memories that comport with other standards, including other LPDDR standards (e.g., earlier versions or future versions like LPDDR6) and to memories that do not adhere to a standard.

As shown in FIG. 2, the processors 202 may include a computer processor 202-1, a baseband processor 202-2, and an application processor 202-3, coupled to the memory device 108 through the interconnect 106. The processors 202 may include or form a part of a CPU, GPU, SoC, ASIC, or FPGA. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). Further, the processor 202 may be realized similar to the processor 110 of FIG. 1. Accordingly, a respective processor 202 can include or be associated with a respective link controller, like the link controller 114 illustrated in FIG. 1. Alternatively, two or more processors 202 may access the memory device 108 using a shared link controller 114.

Example Techniques and Hardware

Figure 3:
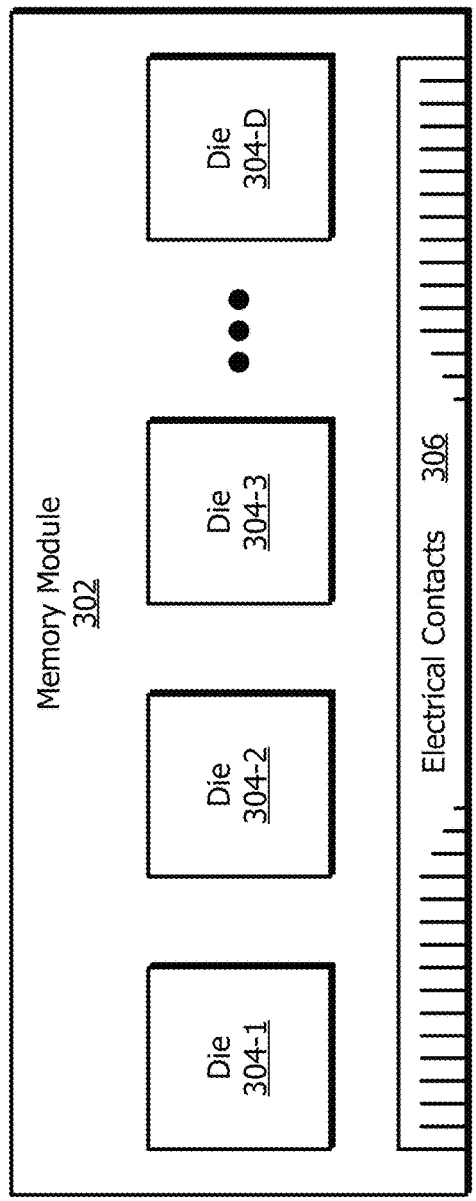
FIG. 3 illustrates an example memory device.

FIG. 3 illustrates an example memory device 300. An example memory module 302 includes multiple dies 304. As illustrated, the memory module 302 includes a first die 304-1, a second die 304-2, a third die 304-3, and a $D^{th}$ die 304-D, with "D" representing a positive integer. As a few examples, the memory module 302 can be a SIMM or a DIMM. As another example, the memory module 302 can interface with other components via a bus interconnect (e.g., a Peripheral Component Interconnect Express (PCIe) bus). The memory device 108 illustrated in FIGS. 1 and 2 can correspond, for example, to a single die 304, multiple dies 304-1 through 304-D, or a memory module 302 with at least one die 304. As shown, the memory module 302 can include one or more electrical contacts 306 (e.g., pins) to interface the memory module 302 to other components.

The memory module 302 can be implemented in various manners. For example, the memory module 302 may include a PCB, and the multiple dies 304-1 through 304-D may be mounted or otherwise attached to the PCB. The dies 304 (e.g., memory dies) may be arranged in a line or along two or more dimensions (e.g., forming a grid or array). The dies 304 may have a similar size or may have different sizes. Each die 304 may be similar to another die 304 or unique in size, shape, data capacity, or control circuitries. The dies 304 may also be positioned on a single side or on multiple sides of the memory module 302. In some cases, the memory module 302 may be part of a CXL memory system or module. Additionally or alternatively, the memory module 302 may include or be a part of another memory device, such as the memory device 108.

Figure 4:
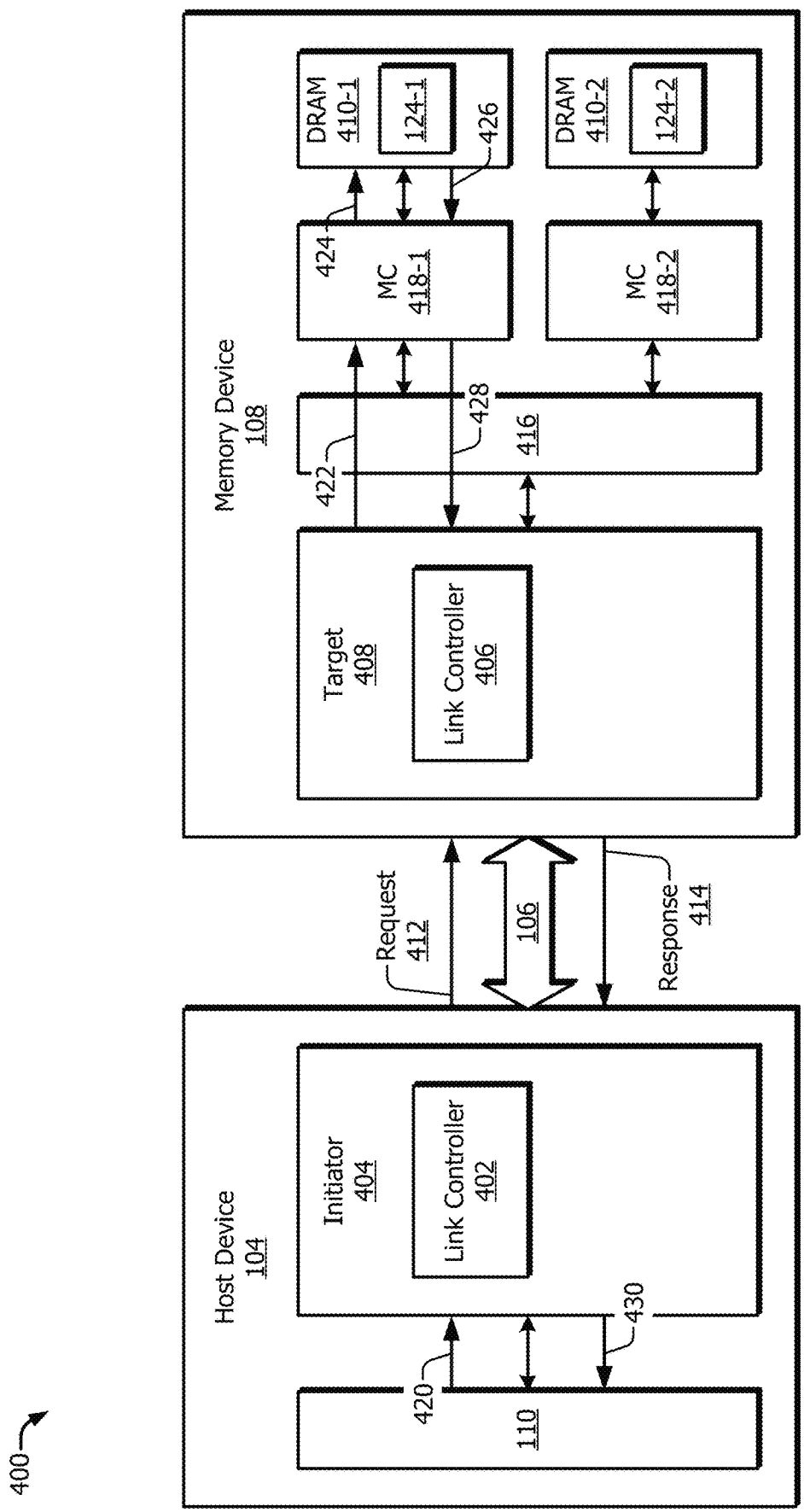
FIG. 4 illustrates an example of a system that includes a host device and a memory device coupled together via an interconnect.

FIG. 4 illustrates an example of a system 400 that includes a host device 104 and a memory device 108 that are coupled together via an interconnect 106. The system 400 may form at least part of an apparatus 102 as shown in FIG. 1. As illustrated, the host device 104 includes a processor 110 and a link controller 402, which can be realized with at least one initiator 404. Thus, the initiator 404 can be coupled to the processor 110 or to the interconnect 106 (including to both), and the initiator 404 can be coupled between the processor 110 and the interconnect 106. Examples of initiators 404 may include a leader, a primary, a master, a main component, and so forth.

In the illustrated example system 400, the memory device 108 includes a link controller 406, which may be realized with at least one target 408. The target 408 can be coupled to the interconnect 106. Thus, the target 408 and the initiator 404 can be coupled to each other via the interconnect 106.

Examples of targets 408 may include a follower, a secondary, a slave, a responding component, and so forth. The memory device 108 also includes a memory (e.g., the memory 122 of FIG. 1), which may be realized with at least one memory module or other component, such as a DRAM 410, as is described further below.

In example implementations, the initiator 404 includes the link controller 402, and the target 408 includes the link controller 406. The link controller 402 or the link controller 406 can instigate, coordinate, cause, or otherwise control signaling across a physical or logical link realized by the interconnect 106 in accordance with one or more protocols. The link controller 402 may be coupled to the interconnect 106. The link controller 406 may also be coupled to the interconnect 106. Thus, the link controller 402 can be coupled to the link controller 406 via the interconnect 106. Each link controller 402 or 406 may, for instance, control communications over the interconnect 106 at a link layer or at one or more other layers of a given protocol. Communication signaling may include, for example, a request 412 (e.g., a write request or a read request), a response 414 (e.g., a write response or a read response), and so forth.

The memory device 108 may further include at least one interconnect 416 and at least one memory controller 418 (e.g., MC 418-1 and MC 418-2). Within the memory device 108, and relative to the target 408, the interconnect 416, the memory controller 418, and/or the DRAM 410 (or other memory component) may be referred to as a "backend" component of the memory device 108. In some cases, the interconnect 416 is internal to the memory device 108 and may operate the same as or differently from the interconnect 106.

As shown, the memory device 108 may include multiple memory controllers 418-1 and 418-2 and/or multiple DRAMs 410-1 and 410-2. Although two each are shown, the memory device 108 may include one or more memory controllers and/or one or more DRAMs. For example, a memory device 108 may include four memory controllers and 16 DRAMs, such as four DRAMs per memory controller. The memory components of the memory device 108 are depicted as DRAM as only an example, for one or more of the memory components may be implemented as another type of memory. For instance, the memory components may include nonvolatile memory like flash or PCM. Alternatively, the memory components may include other types of volatile memory like SRAM. A memory device 108 may also include any combination of memory types.

In some cases, the memory device 108 may include the target 408, the interconnect 416, the at least one memory controller 418, and the at least one DRAM 410 within a single housing or other enclosure. The enclosure, however, may be omitted or may be merged with an enclosure for the host device 104, the system 400, or an apparatus 102 (of FIG. 1). In some cases, each of these components can be realized with a separate IC. In some of such cases, the interconnect 416 can be disposed on a PCB. Each of the target 408, the memory controller 418, and the DRAM 410 may be fabricated on at least one IC and packaged together or separately. The packaged ICs may be secured to or otherwise supported by the PCB and may be directly or indirectly coupled to the interconnect 416. In other cases, the target 408, the interconnect 416, and the one or more memory controllers 418 may be integrated together into one IC. In some of such cases, this IC may be coupled to a PCB, and one or more modules for the memory components may also be coupled to the same PCB, which can form a CXL memory device 108. This memory device 108 may be enclosed within a housing or may include such a housing. The components of the memory device 108 may, however, be fabricated, packaged, combined, and/or housed in other manners.

As illustrated in FIG. 4, the target 408, including the link controller 406 thereof, can be coupled to the interconnect 416. Each memory controller 418 of the multiple memory controllers 418-1 and 418-2 can also be coupled to the interconnect 416. Accordingly, the target 408 and each memory controller 418 of the multiple memory controllers 418-1 and 418-2 can communicate with each other via the interconnect 416. Each memory controller 418 is coupled to at least one DRAM 410. As shown, each respective memory controller 418 of the multiple memory controllers 418-1 and 418-2 is coupled to at least one respective DRAM 410 of the multiple DRAMs 410-1 and 410-2. Each memory controller 418 of the multiple memory controllers 418-1 and 418-2 may, however, be coupled to a respective set of multiple DRAMs 410 or other memory components.

Each memory controller 418 can access at least one DRAM 410 by implementing one or more memory access protocols to facilitate reading or writing data based on at least one memory address. The memory controller 418 can increase bandwidth or reduce latency for the memory accessing based on the memory type or organization of the memory components, like the DRAMs 410. The multiple memory controllers 418-1 and 418-2 and the multiple DRAMs 410-1 and 410-2 can be organized in many different manners. For example, each memory controller 418 can realize one or more memory channels for accessing the DRAMs 410. Further, the DRAMs 410 can be manufactured to include one or more ranks, such as a single-rank or a dual-rank memory module. Each DRAM 410 (e.g., at least one DRAM IC chip) may also include multiple banks, such as 8 or 16 banks.

This document now describes examples of the host device 104 accessing the memory device 108. The examples are described in terms of a general access which may include a memory read access (e.g., a retrieval operation) or a memory write access (e.g., a storage operation). The processor 110 can provide a memory access request 420 to the initiator 404. The memory access request 420 may be propagated over a bus or other interconnect that is internal to the host device 104. This memory access request 420 may be or may include a read request or a write request. The initiator 404, such as the link controller 402 thereof, can reformulate the memory access request into a format that is suitable for the interconnect 106. This formulation may be performed based on a physical protocol or a logical protocol (including both) applicable to the interconnect 106. Examples of such protocols are described below.

The initiator 404 can thus prepare a request 412 and transmit the request 412 over the interconnect 106 to the target 408. The target 408 receives the request 412 from the initiator 404 via the interconnect 106. The target 408, including the link controller 406 thereof, can process the request 412 to determine (e.g., extract or decode) the memory access request. Based on the determined memory access request, the target 408 can forward a memory request 422 over the interconnect 416 to a memory controller 418, which is the first memory controller 418-1 in this example. For other memory accesses, the targeted data may be accessed with the second DRAM 410-2 through the second memory controller 418-2.

The first memory controller 418-1 can prepare a memory command 424 based on the memory request 422. The first memory controller 418-1 can provide the memory command 424 to the first DRAM 410-1 over an interface or interconnect appropriate for the type of DRAM or other memory component. The first DRAM 410-1 receives the memory command 424 from the first memory controller 418-1 and can perform the corresponding memory operation. Based on the results of the memory operation, the first DRAM 410-1 can generate a memory response 426. If the memory request 412 is for a read operation, the memory response 426 can include the requested data. If the memory request 412 is for a write operation, the memory response 426 can include an acknowledgement that the write operation was performed successfully. The first DRAM 410-1 can return the memory response 426 to the first memory controller 418-1.

The first memory controller 418-1 receives the memory response 426 from the first DRAM 410-1. Based on the memory response 426, the first memory controller 418-1 can prepare a memory response 428 and transmit the memory response 428 to the target 408 via the interconnect 416. The target 408 receives the memory response 428 from the first memory controller 418-1 via the interconnect 416. Based on this memory response 428, and responsive to the corresponding request 412, the target 408 can formulate a response 414 for the requested memory operation. The response 414 can include read data or a write acknowledgement and be formulated in accordance with one or more protocols of the interconnect 106.

To respond to the memory request 412 from the host device 104, the target 408 can transmit the response 414 to the initiator 404 over the interconnect 106. Thus, the initiator 404 receives the response 414 from the target 408 via the interconnect 106. The initiator 404 can therefore respond to the "originating" memory access request 420, which is from the processor 110 in this example. To do so, the initiator 404 prepares a memory access response 430 using the information from the response 414 and provides the memory access response 430 to the processor 110. In this way, the host device 104 can obtain memory access services from the memory device 108 using the interconnect 106. Example aspects of an interconnect 106 are described next.

The interconnect 106 can be implemented in a myriad of manners to enable memory-related communications to be exchanged between the initiator 404 and the target 408. Generally, the interconnect 106 can carry memory-related information, such as data or a memory address, between the initiator 404 and the target 408. In some cases, the initiator 404 or the target 408 (including both) can prepare memory-related information for communication across the interconnect 106 by encapsulating such information. The memory-related information can be encapsulated into, for example, at least one packet (e.g., a flit). One or more packets may include headers with information indicating or describing the content of each packet.

In example implementations, the interconnect 106 can support, enforce, or enable memory coherency for a shared memory system, for a cache memory, for combinations thereof, and so forth. Additionally or alternatively, the interconnect 106 can be operated based on a credit allocation system. Possession of a credit can enable an entity, such as the initiator 404, to transmit another memory request 412 to the target 408. The target 408 may return credits to "refill" a credit balance at the initiator 404. A credit-based communication scheme across the interconnect 106 may be implemented by credit logic of the target 408 or by credit logic of the initiator 404 (including by both working together in tandem).

In some implementations, the memory device 108 includes the logic circuitry 124 (or the logic circuit 204, not shown in FIG. 4). For example, the logic circuitry 124-1 and 124-2 can be realized as part of the DRAMs 410-1 and 410-2, respectively, as shown in FIG. 4. In other cases, the logic circuitry 124 may be incorporated in or at another component of the memory device 108. The logic circuitry 124 can be used to write values to a memory register (not shown in FIG. 4) that may be readable by a controller, such as the memory controller 418. For example, the logic circuitry 124 can write values to either or both of the bank-refresh register 126 or the counter register 128). In some implementations, the controller may include one or more dedicated logic circuits (not shown in FIG. 4) to read particular registers (e.g., one to read the bank-refresh register 126 and another to read the counter register 128). Operations of the logic circuitry 124, logic circuit 204, and associated controllers are described in more detail with reference to FIG. 5 through FIG. 9. Additionally or alternatively, the link controller 120 (of FIG. 1) may also guide or support refresh operations of the DRAMs 410 or multiple banks of the dies 304 (of FIG. 3).

The system 400, the initiator 404 of the host device 104, or the target 408 of the memory device 108 may operate or interface with the interconnect 106 in accordance with one or more physical or logical protocols. For example, the interconnect 106 may be built in accordance with a Peripheral Component Interconnect Express (PCIe or PCI-e) standard. Applicable versions of the PCIe standard may include 1.x, 2.x, 3.x, 4.0, 5.0, 6.0, and future or alternative versions. In some cases, at least one other standard is layered over the physical-oriented PCIe standard. For example, the initiator 404 or the target 408 can communicate over the interconnect 106 in accordance with a Compute Express Link (CXL) standard. Applicable versions of the CXL standard may include 1.x, 2.0, and future or alternative versions. The CXL standard may operate based on credits, such as read credits and write credits. In such implementations, the link controller 402 and the link controller 406 can be CXL controllers.

Figure 5:
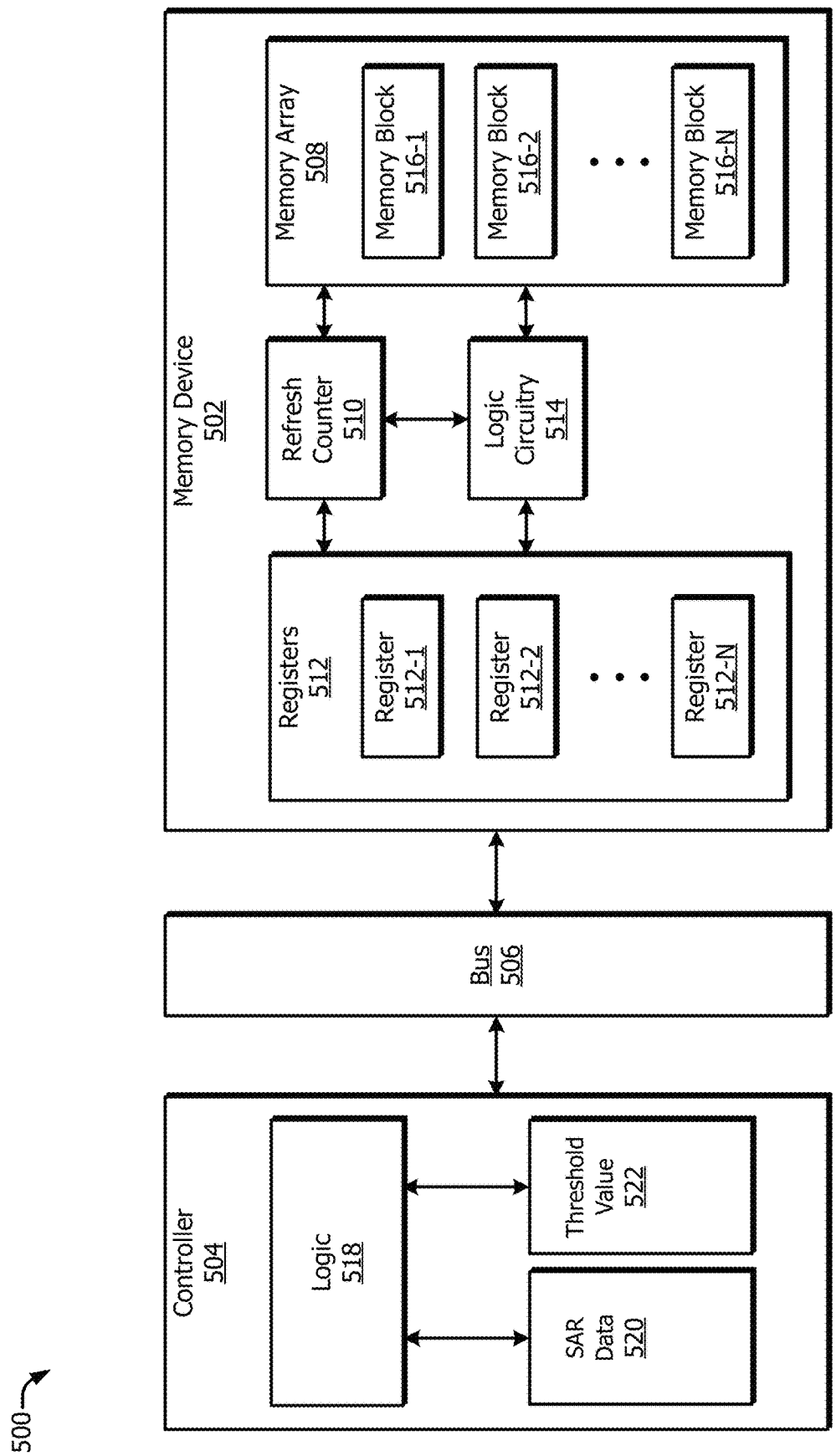
FIG. 5 illustrates a portion of an example memory system that can implement aspects of adaptive memory registers.

FIG. 5 illustrates a portion of an example memory system 500 that can implement aspects of adaptive memory registers. The example memory system 500 can include a memory device 502, a controller 504, and a bus 506. The memory device 502 can include a memory array 508 (array 508), refresh counter 510, memory registers 512, and logic circuitry 514. The array 508 can be any of a variety of memory types and may include multiple memory blocks 516 that can be used to organize memory cells of the array 508. For example, the memory blocks 516-1 through 516-N may be banks of a DRAM (e.g., bank 0 through bank N). In some implementations, the memory array 508 can be realized with, or as part of, the memory 122 of FIG. 1 and/or the DRAM 410 of FIG. 4.

The refresh counter 510 can be any suitable counter mechanism (e.g., hardware, logic, firmware) that can be used to store or provide one or more row addresses or partial row address(es) that are to be or have been refreshed. For example, the counter can store bits that represent a next address (e.g., at least a portion of a row address) to be refreshed. A processor (e.g., a memory controller) can read the bits to determine what row or rows are to be refreshed when a next refresh command is transmitted to the array 508. In another example, the counter can store or provide row addresses for one or more rows that were most recently refreshed and determine the next address (or addresses) to be refreshed, based on the most-recently refreshed address(es).

The memory registers 512 can be a variety of registers (e.g., mode registers). In some implementations, for example, the memory register 512 can include the bank-refresh register 126 and/or the counter register 128 of FIG. 1, which may include multiple memory registers 512-1 through 512-N. The memory registers 512 may be coupled, directly or indirectly, to one or more of the memory array 508, the refresh counter 510, or the logic circuitry 514.

The logic circuitry 514 can be any suitable logic that can be used to enable aspects of adaptive memory registers, as described in this document. The logic circuitry 514 may be coupled, directly or indirectly, to the memory array 508 in any of a number of configurations. For example, the logic circuitry 514 can include or be a part of the logic circuitry 124 and/or the logic circuit 204, as described in this document.

The controller 504 can be a controller or processor that can transmit signals to the memory device 502 and the memory array 508. For example, the controller 504 can be realized as or with the link controller 120, the control circuitry 210, or the memory controller 418. The controller 504 can read the memory registers 512 to implement aspects of adaptive memory registers. For example, the controller 504 can include or have access to logic 518. The logic 518 can be used to read entries of the memory registers 512 to determine which memory blocks or banks of the array 508 have been refreshed within a current refresh interval (e.g., by reading the bank-refresh register 126 as described with reference to FIG. 1). In these implementations, the logic 518 can read the values from the register entries and based on the values, determine which blocks or banks have not been refreshed within the current refresh interval. Then, the logic can transmit a signal that indicates which block or bank is to be refreshed when the next refresh command is issued (e.g., after exiting a self-refresh mode or when issuing refresh commands for a given refresh interval).

The logic 518 can also or instead be used to determine an address of a row of the array 508 that is to be refreshed next in a current refresh interval (e.g., by reading the counter register 128 as described with reference to FIG. 1). In some implementations, the determination of the next row to be refreshed can be used to prioritized refresh operations for a row that may be affected by a usage-based disturb (or disturbance), or a suspected affected row (SAR). A usage-based disturb is an effect on memory cells adjacent to cells being refreshed (e.g., to cells of a row/wordline adjunct to the row/wordline being refreshed). Because of the electrical interactions between memory cells, especially at higher densities, if a row is repeatedly refreshed (or activated or charged) then the charges of cells in nearby rows can degrade or become corrupted. Thus, if a malicious actor learns the row-location of information the actor wants to corrupt, the actor can focus on rows/wordlines near the target and activate those rows/wordlines repeatedly to try to corrupt the target. Prioritizing SARs for refresh operations can help reduce adverse effects of the usage-based disturb.

For example, the controller 504 can include or have access to data 520 related to suspected affected rows (SAR data 520) and/or a prioritization distance threshold value 522 (threshold value 522) that represents a distance threshold (e.g., a quantity of rows) for prioritizing affected rows. The SAR data 520 can be a list of row addresses for SARs. The list can be determined or accessed by the controller 504 (e.g., based on how many times a particular row is activated or precharged). The threshold value 522 can be determined or accessed by the controller 504 based on any of a variety of factors (e.g., vendor, manufacturer, or user selection, a quantity of activation/precharge events in a given time, an indication of importance of data stored by nearby rows, frequency of usage-based disturb events).

Using the values read from the entries in the register, the SAR data 520, and the threshold value 522, the logic 518 can determine how many row addresses are between the row represented by the bits in the register and another row address in the SAR data 520 (e.g., the row address currently "first" or "most likely affected" on a list of suspected affected rows). Once the quantity of rows between the addresses is determined, the logic 518 can adjust the SAR data 520, based on the quantity and a threshold value. For example, the logic 518 can determine that an address in the SAR data 520 should be prioritized for refresh operations and refresh the row before it would be refreshed according to a standard refresh schedule. In other cases, the logic 518 can determine that the standard refresh schedule will be adequate to account for the effects of any suspected usage-based disturb.

As shown in FIG. 5, the array 508, the refresh counter 510, the registers 512, and the logic circuitry 514 are communicatively coupled to each other. In some implementations, other configurations of the communicative coupling, directly or indirectly, are possible. Further, the memory device 502 may also include other components, including those that may be connected to or between illustrated items. For clarity of the illustrated items, these other components are not shown in FIG. 5.

The bus 506 can be any suitable bus or other interconnect that can be used to transmit signals and/or data between the memory device 502 and the controller 504. In some implementations, the bus may be realized as or with the interconnect 106 or the interconnect 416.

In some implementations, the example memory system 500 may be implemented as part of another device, such as the memory device 108 (e.g., with or as part of the memory 122), the memory module 302, or the DRAM 410. Additionally or alternatively, the example memory system 500 may be implemented as part of a CXL device (e.g., a Type 1 CXL device, a Type 2 CXL device, or a Type 3 CXL device). For example, the memory system 500 can include or be coupled to an interface that can couple to a host device (e.g., the host device 104) via an interconnect, such as the interconnect 106. The memory system 500 can also include or be coupled to a link controller (e.g., the link controller 406) that can be coupled to the interface and communicate with the host device. In some implementations, the interconnect can be an interconnect that can comport with at least one Compute Express Link (CXL) standard and the link controller may be a CXL controller.

Example Implementations

Figures 1, 6:
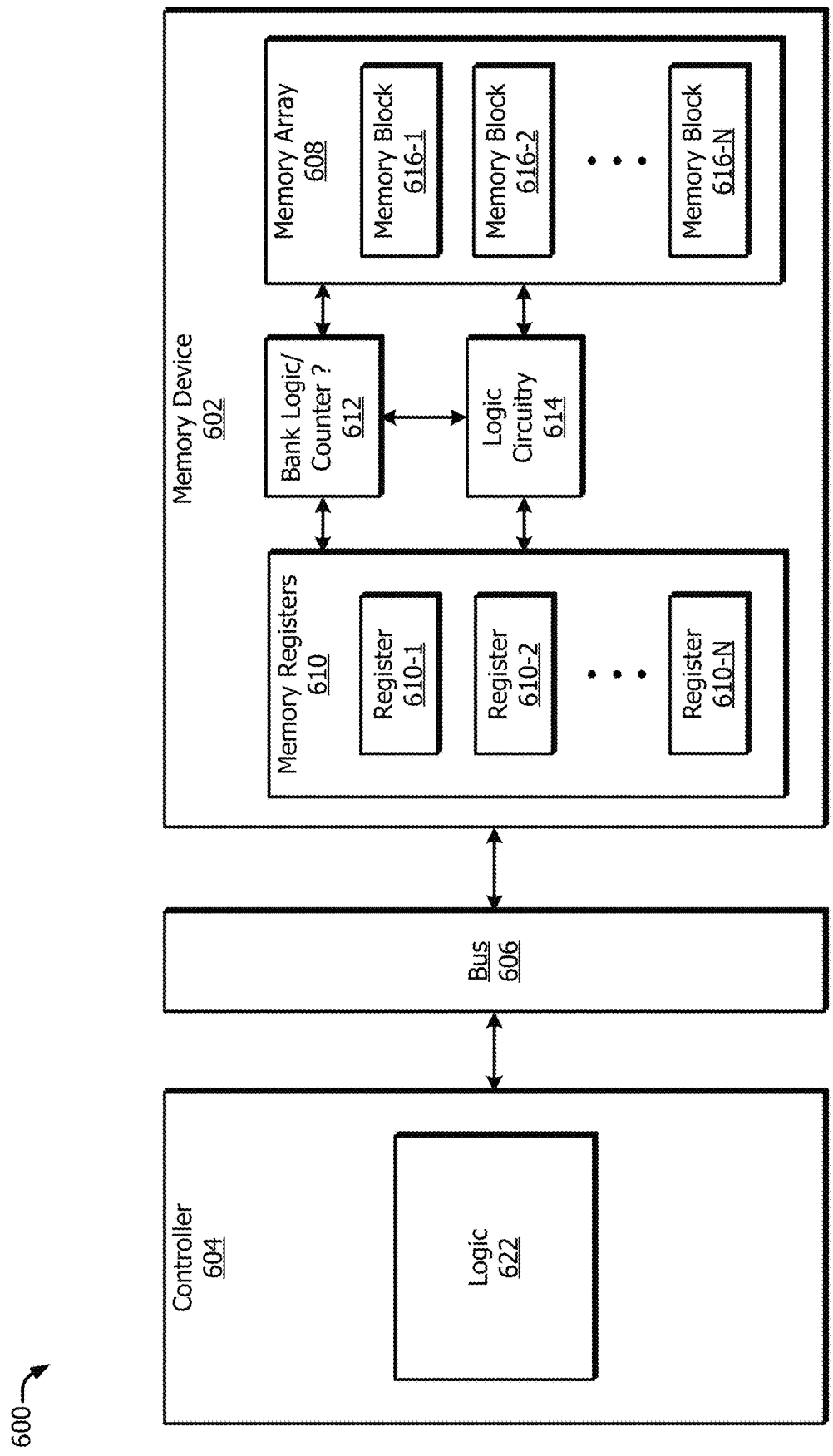
Figures 2, 6:
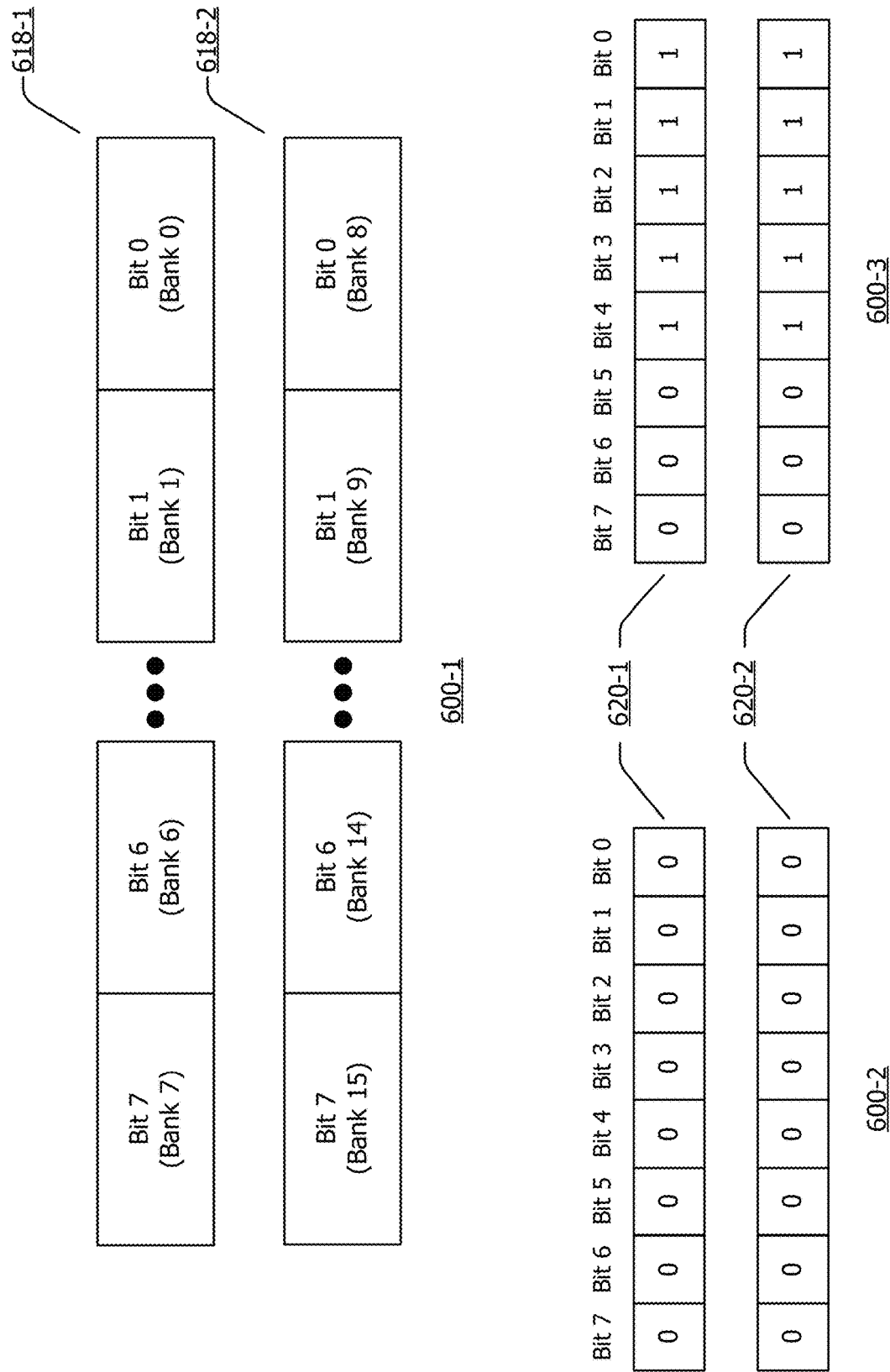

FIG. 6-1 illustrates a portion of another example memory system 600 that can implement aspects of adaptive memory registers. The example memory system 600 can include a memory device 602, a controller 604, and a bus 606. The memory device 602 can include a memory array 608 (array 608), at least one memory register 610, a bank logic 612, and logic circuitry 614. The array 608 can be any of a variety of memory types and may include multiple memory blocks 616 that can be used to organize memory cells of the array 608. For example, the memory blocks 616-1 through 616-N may be banks of a DRAM (e.g., where the memory array 608 is a DRAM with N banks, memory blocks 616-1 through 616-N correspond to bank 0 through bank N, respectively). In some implementations, the array 608 can be realized with, or as part of, the memory 122 of FIG. 1, the DRAM 410 of FIG. 4, and/or the array 508 of FIG. 5. Further, the array 608 can be realized as part of, or with, a memory array that comports with at least one low-power double data rate (LPDDR) standard (e.g., LPDDR5, or 5.x, or another standard).

The memory registers 610 can be any available memory registers with total usable bits equal to the number of memory blocks 616 (e.g., at least a portion of a currently unused register). In some implementations, the memory registers 610 can include or be part of a mode register of the memory device 602. The memory registers 610 can also or instead be realized with the bank-refresh register 126 of FIG. 1. The memory registers 610 may be coupled, directly or indirectly, to one or more of the array 608, the bank logic 612, or the logic circuitry 614. In an example implementation in which the memory registers 610 correspond to mode registers (or a portion of a mode register) of the memory device 602 and the memory blocks 616 correspond to banks of a DRAM device, each bit of the mode registers can be assigned to one bank. In this case, therefore, "N" banks require "N" bits and if the mode register comprises 8 bits, then N/8 memory registers are required (rounded up to the next higher integer). The memory registers 610 can be read by the controller 604 or by other logic (e.g., other logic included with the memory device 602 or logic that is separate from, but coupled to, the memory system 600, such as logic included with a host device coupled to the example memory system 600.

Consider detail view 600-1 of FIG. 6-2, which illustrates example memory registers 618 with 8 entries (e.g., bits) each (618-1 and 618-2). For this example, assume that the array 608 includes 16 banks (e.g., N=16). The bits of the example memory registers 618-1 and 618-2 correspond to the respective 16 banks. Thus, bits 0-7 (e.g., bits in the entries 0-7) of the example memory register 618-1 correspond to banks 0-7 of the array 608 and bits 0-7 (e.g., bits in the entries 0-7) of the example memory register 618-2 correspond to banks 8-15 of the array 608.

Returning to FIG. 6-1, the bank logic 612 can be any suitable counter mechanism (e.g., hardware, logic, firmware) that can be used to store or provide information or data that indicates which memory blocks or banks have been refreshed in a given refresh interval. For example, the bank logic 612 can be coupled (directly or indirectly) with a row counter (e.g., the refresh counter 510, not shown in FIG. 6-1), the array 608, and logic that controls refresh operations (e.g., refresh commands) for the array 608. The bank logic 612 can store information or data that represents a next memory block or bank to be refreshed, based on the refresh operations that have already been completed. For example, the row counter indicates which rows have been completed for all banks and the bank logic 612 can determine which banks have and have not been refreshed for the current row being refreshed. In another example, the bank logic 612 can store or provide data for one or more memory blocks or banks that were most recently refreshed and determine the next memory blocks or banks to be refreshed, based on the most-recently refreshed memory blocks or banks.

The logic circuitry 614 can be any suitable type of logic that can be used to determine which memory blocks of the multiple memory blocks 616 have been refreshed within a current refresh interval and write values to entries of the memory registers 610 that are associated with respective memory blocks of the multiple memory blocks 616 (e.g., the memory blocks 616-1 through 616-N). In some implementations, an entry of the respective entries can be a bit stored in the memory register 610. The values can indicate whether the respective memory blocks have been refreshed within a current refresh interval. For example, the logic circuitry 614 can access the bank logic 612, a row counter (e.g., the refresh counter 510), and/or other components of (or in communication with) the memory system 600 to determine what row/wordlines have been refreshed and which banks have completed those refresh operations. The logic circuitry 614 can then write the values to the respective entries of the associated memory register 610, to indicate whether the respective memory block/bank 616 has been refreshed during the current refresh interval.

In some implementations, the logic circuitry 614 can write the values to the entries in real-time or nearly real-time. For example, the logic circuitry 614 can write the values to the entries before the array 608 receives a signal indicative of a command to execute refresh operations within a next refresh interval. Thus, when a particular memory block 616 is refreshed (e.g., when a row/wordline is refreshed), the logic circuitry 614 can write the appropriate value to the entry of the associated memory register 610 that corresponds to the refreshed memory block 616 at least before the particular memory block is refreshed again. In another example, the logic circuitry 614 can write the appropriate value to the entry of the associated memory register 610 that corresponds to the refreshed memory block 616 immediately after the particular memory block 616 is refreshed.

To aid in performing these steps, the logic circuitry 614 may be coupled, directly or indirectly, to a row counter (e.g., the refresh counter 510, not shown in FIG. 6-1), the memory array 608, the bank logic 612, and/or the memory registers 610 in any of a number of configurations. For example, the logic circuitry 614 can include or be a part of the logic circuitry 124, the logic circuit 204, and/or the logic circuitry 514 of FIG. 5, as described in this document. Further, the memory device 602 may also include other components, including those that may be connected to or between illustrated items. For clarity of the illustrated items, these other components are not shown in FIG. 6-1.

Consider detail views 600-2 and 600-3 of FIG. 6-2, which illustrates example memory registers 620 with 8 bits each (memory registers 620-1 and 620-2). For this example, again assume that the array 608 includes 16 banks and that entries/bits 0-7 of the memory register 620-1 correspond to banks 0-7 of the array 608 and entries/bits 0-7 of the memory register 620-2 correspond to banks 8-15 of the array 608. In FIG. 6-2, the detail views 600-2 and 600-3 illustrate the same example memory registers 620 at different times. At a time when none of the banks have been refreshed during a current refresh interval, as shown in the detail view 600-2, all bits of both memory registers 620-1 and 620-2 are set to "0". At another time, when refresh operations are complete for at least some banks (e.g., for one or more rows/wordlines of at least one bank), the logic circuitry 614 writes a value to the entry of the memory register 620 that corresponds to the refreshed bank to indicate that the bank has been refreshed (e.g., the logic circuitry 614 writes a "1" to the corresponding entries for refreshed banks). For example, in the detail view 600-3, banks 0-4 and banks 8-12 have been refreshed and, therefore, the logic circuitry 614 has written "1" to entries 0-4 of both memory registers 620-1 and 620-2. When all N banks of the array 608 (e.g., 16 in this example) have been refreshed, the entries are all reset to "0" (e.g., the logic circuitry 614 writes "0" to all 16 entries), as shown in the detail view 600-2.

Thus, the logic circuitry 614 can determine that a portion of the multiple memory blocks 616 has been refreshed within the current refresh interval and write values to associated memory registers 620 to indicate which of the respective memory blocks 616 have been refreshed within the current refresh interval and which of the respective memory blocks 616 have not been refreshed within the current refresh interval. For example, the logic circuitry 614 can write "1" to the memory registers 620 corresponding to the memory banks 616 that have been refreshed and write "0" to the memory registers 620 corresponding to the memory banks 616 that have not been refreshed (if the entry was not already "0"). Then, when the logic circuitry 614 determines that all of the multiple memory blocks 616 have been refreshed within the current refresh interval, the logic circuitry 614 can write values to indicate that, for another refresh interval after the current refresh interval, none of the multiple memory blocks 616 have been refreshed (e.g., write "0" to all the entries of the memory registers 620).

While the above example describes the logic circuitry 614 writing "1" to register entries for memory blocks that have been refreshed and "0" for memory blocks that have not been refreshed, other configurations are possible. For example, the logic circuitry 614 can write "0" to the memory registers 620 corresponding to the memory blocks 616 that have been refreshed and write "1" to the memory registers 620 corresponding to the memory blocks 616 that have not been refreshed (if the entry was not already "1"). Similarly, when the logic circuitry 614 determines that all of the multiple memory blocks 616 have been refreshed within the current refresh interval, the logic circuitry 614 can write "1" to all the entries of the memory registers 620 to indicate that, for the other refresh interval after the current refresh interval, none of the multiple memory blocks 616 have been refreshed.

Returning to FIG. 6-1, the controller 604 can be a controller or processor that can transmit signals to the memory device 602 to implement aspects of adaptive memory registers. For example, the controller 604 can be realized as or with the link controller 120, the control circuitry 210, the memory controller 418, or the controller 504. The controller 604 can be coupled to the memory device 602 to communicate with the array 608 (including the multiple memory blocks 616) and the memory registers 610.

For example, the controller 604 can include or have access to logic 622, which can be connected, directly or indirectly, to the array 608 and the memory registers 610. The logic 622 can be used to determine that at least some of the memory blocks 616 are to be refreshed (e.g., during a current refresh interval or based on other criteria, such as exiting a self-refresh state). The logic 622 can also read the value of the bits stored in the memory registers 610 that are associated with respective blocks 616 (e.g., read entries of the memory registers 610). For example, the logic 622 can read the values in response to a determination that a timing-based refresh operation is required to conform to one or more memory operation standards (e.g., LPDDR5, 5.x, or 6) or that a refresh operation is required based on entry into, or exit from, a self-refresh (or other lower-power) mode.

In some implementations, the logic 622 can read the register prior to every refresh command (e.g. an interval-based command or a refresh command based on another criteria) that is scheduled to be issued. The logic 622 can then issue the refresh commands only to the memory blocks 616 of the array 608 (e.g., memory banks of a DRAM) with corresponding register entries that indicate that the memory blocks 616 have not been refreshed within the current refresh interval (or that the memory blocks 616 remain unrefreshed after exiting the self-refresh state).

Based on the values, the logic 622 can determine which memory blocks 616 of the array 608 have not been refreshed within the current refresh interval (or which memory blocks 616 remain unrefreshed after exiting the self-refresh state). For example, the logic 622 can read the registers 610 using a mode register read command and determine that memory blocks 616 corresponding to register entries with a value of "0" have not been refreshed within the current refresh interval. Accordingly, the logic 622 can determine that memory blocks 616 corresponding to register entries with a value of "1" have been refreshed within the current refresh interval. As described above, the values "0" and "1" can instead indicate refreshed, and not refreshed, respectively.

The logic 622 also can transmit a signal indicative of a command to execute refresh operations for the portion of the multiple memory blocks 616 that has not been refreshed within the current refresh interval (e.g., an auto-refresh command, an all-bank refresh command, a per-bank refresh command, or another command). For example, as described the logic 622 can determine, based on the values read from the registers 610, which memory blocks 616 have not been refreshed within the current refresh interval (or remain unrefreshed after exiting the self-refresh state) and refresh only those memory blocks 616.

The bus 606 can be any suitable bus or other interconnect that can be used to transmit signals and/or data between the memory device 602 and the controller 604. In some implementations, the bus may be realized as or with the interconnect 106, the interconnect 416, or the bus 506.

In some implementations, the example memory system 600 may be implemented as part of another device, such as the memory device 108 (e.g., with or as part of the memory 122), the memory module 302, the DRAM 410, or the memory system 500. Additionally or alternatively, the example memory system 600 may be implemented as part of a CXL device (e.g., a Type 1 CXL device, a Type 2 CXL device, or a Type 3 CXL device). For example, the memory system 600 can include or be coupled to an interface that can couple to a host device (e.g., the host device 104) via an interconnect, such as the interconnect 106. The memory system 600 can also include or be coupled to a link controller (e.g., the link controller 406) that can be coupled to the interface and communicate with the host device. In some implementations, the interconnect can be an interconnect that can comport with at least one Compute Express Link (CXL) standard and the link controller may be a CXL controller.

Using these techniques can reduce the peak current drawn during regular refresh operations (e.g., standards-based time interval refresh operations) because all-bank refresh can be avoided when the logic circuitry 614 reads the registers 610 to determine the memory blocks 616 that have been refreshed in the current refresh interval. Further, in addition to power savings, reducing the peak current draw can enable lower costs for the power distribution network on the die on the printed circuit board to which the memory system 600 is affixed.

Similarly, upon exit from a self-refresh state, the logic circuitry 614 can read the registers 610 to determine the memory blocks 616 that have been refreshed. This can help avoid or reduce the number of all-bank refresh operations (and the associated higher peak current draw) upon self-refresh exit. This is because in the self-refresh state the memory (e.g., a die) internally issues the refresh command and keeps track of the refreshed banks. The described features give the memory controller 604 access to this information.

Figures 1, 7:
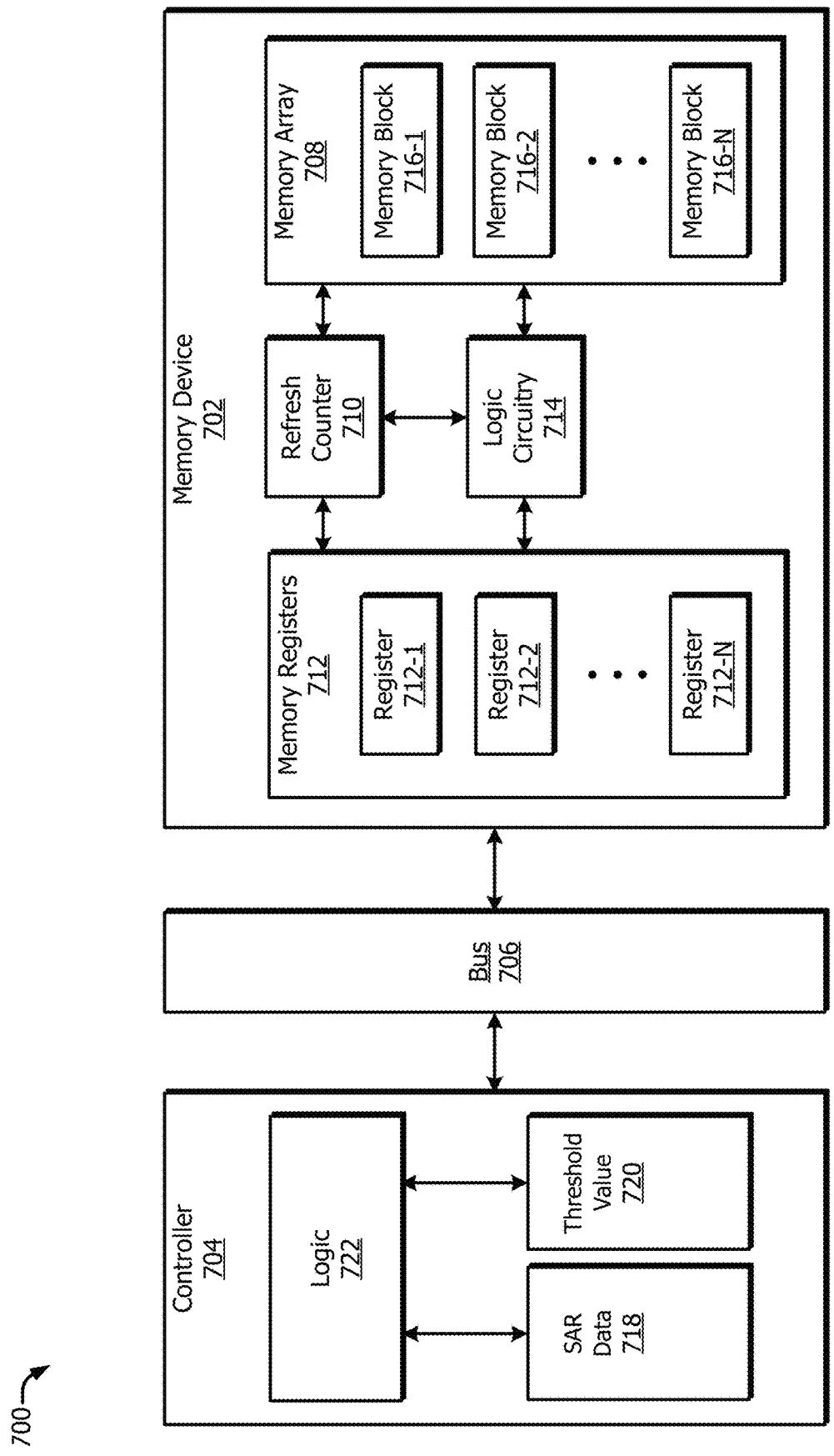
Figures 2, 7:
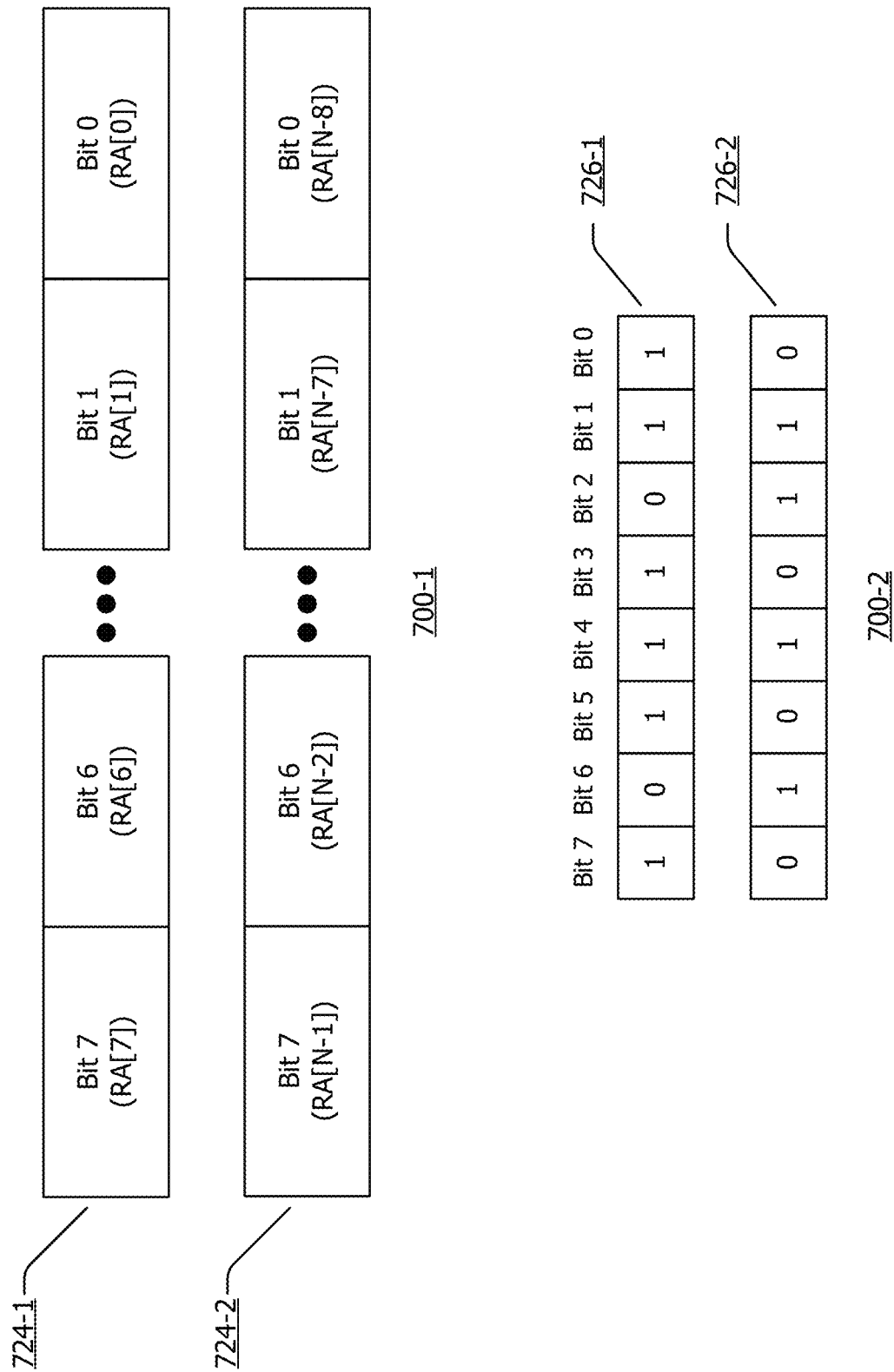
Figures 3, 7:
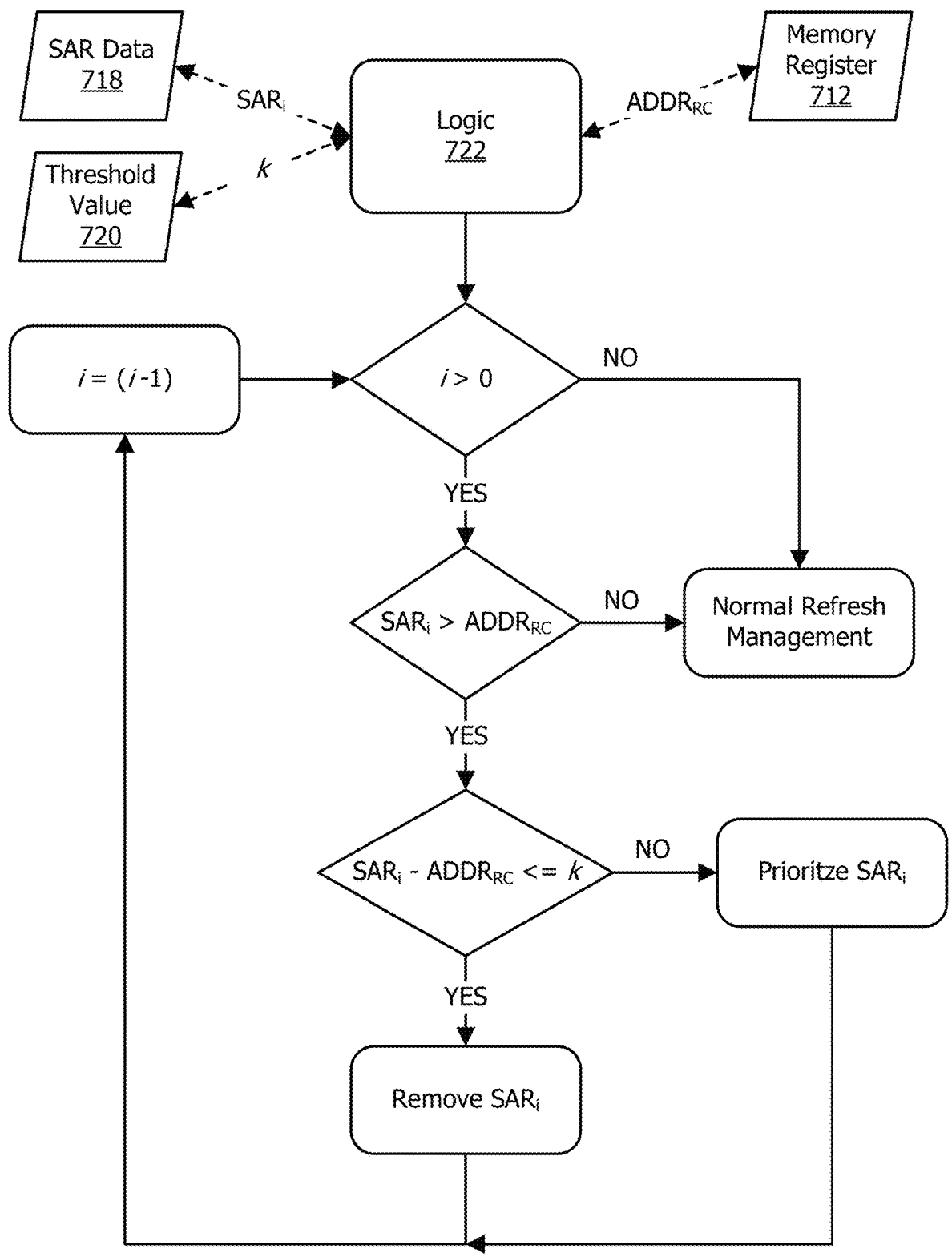

FIG. 7-1 illustrates a portion of an example memory system 700 that can implement aspects of adaptive memory registers. The example memory system 700 can include a memory device 702, a controller 704, and a bus 706. The memory device 702 can include a memory array 708 (array 708), a refresh counter 710, at least one memory register 712, and logic circuitry 714. The array 708 can be any of a variety of memory types and may include multiple memory blocks 716 that can be used to organize memory cells of the array 708. For example, the memory blocks 716-1 through 716-N may be banks of a DRAM (e.g., where the memory array 708 is a DRAM with N banks, memory blocks 716-1 through 716-N correspond to bank 0 through bank N, respectively). In some implementations, the array 708 can be realized with, or as part of, the memory 122 of FIG. 1, the DRAM 410 of FIG. 4, the array 508 of FIG. 5, and/or the array 608 of FIG. 6-1. Further, the array 708 can be realized as part of, or with, a memory array that comports with at least one low-power double data rate (LPDDR) standard (e.g., LPDDR5, or 5.x, or another standard).

The refresh counter 710 can be any suitable counter mechanism (e.g., hardware, logic, firmware) that can be used to store or provide at least a portion of an address (or addresses) that is indicative of a refresh operation for a row of the array 708. For example, the refresh counter 710 can store bits that represent a next address (e.g., at least a portion of a row address) to be refreshed. In another example, the refresh counter 710 can store or provide at least a portion of a row address for one or more rows that were most-recently refreshed. The next address (or addresses) to be refreshed can then be determined based on the most-recently refreshed address(es). In still another example, the refresh counter 710 can store or provide at least a portion of a row address for one or more rows for which refresh operations are currently in progress. The next address (or addresses) to be refreshed can then be determined based on the address of the in-progress address(es).

Consider an example in which the array 708 receives a command to refresh row n for N banks (e.g., a REFab or REFpb command). When row n has completed refresh for all N banks (e.g., 4 or 8 or 16 banks), the refresh counter 710 increments (e.g., the next row address to be refreshed or the row address of the row most-recently refresh is stored by the refresh counter 710, replacing the previous contents). In some implementations, a processor (e.g., a memory controller or other logic circuitry) can read the bits stored or provided by the refresh counter 710 to determine what row or rows are to be refreshed when a next refresh command is transmitted to the array 508.

The memory registers 712 can be any available memory registers with total usable bits equal to the number of bits the refresh counter 710 uses to store the row addresses or partial row addresses (e.g., at least a portion of a currently unused register). In some implementations, the memory registers 712 can include or be part of a mode register of the memory device 702. The memory registers 712 can also or instead be realized with the counter register 128 of FIG. 1. The memory registers 712 may be coupled, directly or indirectly, to one or more of the array 708, the refresh counter 710, or the logic circuitry 714. In an example implementation, the memory registers 712 can be read by the controller 704 or by other logic (e.g., other logic included with the memory device 702 or logic that is separate from, but coupled to, the memory system 700, such as logic included with a host device coupled to the example memory system 700.

Consider detail views 700-1 and 700-2 of FIG. 7-2, which illustrate entries of example memory registers 724 with eight entries (e.g., bits) each (724-1 and 724-2). For this example, assume that the refresh counter 710 stores the row address(es) or partial row address(es) using 16 bits (e.g., N=16) and the row address is represented as RA[N−1:0]. The 16 bits of the example memory registers 724-1 and 724-2 correspond to the 16 address bits. Thus, bits 0-7 (e.g., bits in the entries 0-7) of the example memory register 724-1 correspond to RA[0] to RA[7] and bits 0-7 (e.g., bits in the entries 0-7) of the example memory register 724-2 correspond to bits RA[N−8] to RA[N−1]. To describe the example in more detail, the detail view 700-2 illustrates example memory registers 726, with eight entries each, storing memory address 56BB (hexadecimal format). The registers 726-1 (written as R1 below) and 726-2 (written as R2 below) correspond to the address representation RA[N−1:0] as RA[15:0]=(R2 [7:0], R1 [7:0])=0101011010111011 (binary) which is address 56BB (hexadecimal).

Returning to FIG. 7-1, the logic circuitry 714 can be any suitable type of logic that can be used to write values to respective entries of the memory register 712. The values represent the address (or partial address or multiple addresses or partial addresses) stored or provided by the refresh counter 710, which indicates the refresh operation for the row of the array 708. For example, the logic circuitry 714 can access a refresh counter (e.g., the refresh counter 710) and/or other components of (or in communication with) the memory system 700 to determine what rows/wordlines have been refreshed and which banks have completed those refresh operations. The logic circuitry 714 can then write the values to the respective entries of the associated memory register 712 to indicate what address (e.g. row address) is next to be refreshed. An entry of the memory register 712 can be, for example, a bit stored in the memory register 712.

Further, by virtue of having access to the refresh counter 710, the logic circuitry 714 can determine when the refresh counter 710 increments. Based on this determination, the logic circuitry 714 can write other values to respective entries of the memory register 712 that represent another address indicative of another refresh operation for another row of the memory array. Thus, when the refresh counter 710 increments, the logic circuitry can update the memory registers 712 to reflect the incremented address.

In some implementations, the logic circuitry 714 can write the values to the entries in real-time or nearly real-time. For example, the logic circuitry 714 can write the values to the entries of the memory register 712 before the refresh counter takes on another value (e.g., before the refresh counter 710 increments). Thus, when a particular memory address is refreshed (e.g., when a row/wordline is refreshed), the logic circuitry 714 can write the appropriate values to the entries of the memory register 712 at least before the refresh counter 710 increments. In another example, the logic circuitry 714 can write the appropriate values to the entries of the memory register 712 immediately after the refresh counter 710 increments. In either example (writing the values before or after incrementation) the logic circuitry 714 writes the values to the memory registers 712 in a consistent manner, so that the memory registers 712 store a row address that allows the logic circuitry 714 to determine the next row that is to be refreshed.

The controller 704 can be a controller or processor that can transmit signals to the memory array 708 to implement aspects of adaptive memory registers. For example, the controller 704 can be realized as or with the link controller 120, the control circuitry 210, the memory controller 418, the controller 504, or the controller 604. The controller 704 can be coupled to the memory device 702 (e.g., via the bus 706). In some implementations, the controller 704 can include or have access to data 718 related to activation-based refresh operations for suspected affected rows (SAR data 718) and/or a prioritization distance threshold value 720 (threshold value 720). The controller 704 can also include logic 722.

A suspected affect row (SAR) is a row that may be affected by a usage-based disturb. A usage-based disturb is an effect on memory cells adjacent to cells being refreshed (e.g., to cells of a row/wordline adjunct to the row/wordline being activated and refreshed). Because of the electrical interactions between memory cells, especially at higher densities, if a row is repeatedly refreshed (or activated or charged) then the charges of cells in nearby rows can degrade or become corrupted. Thus, if a malicious actor learns the row-location of information the actor wants to corrupt, the actor can focus on rows/wordlines near the target and activate those rows/wordlines repeatedly to try to corrupt the target. Prioritizing SARs for activation-based refresh operations (e.g., in response to a usage-based disturb) can help reduce adverse effects of the usage-based disturb.

The SAR data 718 can be a list of addresses that are related to activation-based refresh operations, such as a list of SAR addresses. For example, the addresses can be for rows near (e.g., adjacent to, within a few or several rows of) rows that are the subject of the usage-based disturb—such as the row being repeatedly activated/refreshed. In some implementations, to determine the SAR data 718, the rows of the array 708 can be monitored for activation patterns (e.g., repetition, frequency, duration, or combinations of these and/or other factors) that may indicate a usage-based disturb. Addresses for nearby rows that meet predetermined (or selectable) criteria for classification as a SAR can be stored as the SAR data 718.

The threshold value 720 can be a threshold number of rows between a row currently being refreshed (or that is next to be refreshed, or that was most recently refreshed) and a row included in the SAR data 718 (e.g., a SAR that is prioritized for activation-based refresh operations based on a suspected usage-based disturb). For example, the threshold value 720 can be three, six, ten, fifteen, or twenty rows. In some implementations, the threshold value 720 can be inclusive (e.g., the threshold is exceeded when the value to be compared with the threshold is greater than the threshold). In other cases, the threshold value 720 can be exclusive (e.g., the threshold is exceeded when the value to be compared with the threshold is greater than or equal to the threshold). The threshold value 720 can be predetermined or selectable (e.g., by a vendor, a customer, or by a user at manufacturing, testing, or in the field). The threshold value 720 can be determined or accessed by the controller 704 based on any of a variety of factors (e.g., vendor, manufacturer, user selection, a quantity of activation/precharge/refresh events in a given time, an indication of importance of data stored by nearby rows, frequency of usage-based disturb events).

The logic 722 can be coupled, directly or indirectly, to the array 708 and the memory registers 712. The logic 722 can read values from a memory register associated with the memory array 708 (e.g., bits stored by the memory register 712). In some implementations, the logic 722 can read the values from the memory register 712 using a mode register read command. The values can represent at least a portion of an address of the memory array 708 that corresponds to a refresh operation for a row of the memory array 708. For example, the portion of the address can be a partial row address that corresponds to one or more rows of the array 708 (e.g., bits that represent a single address or multiple addresses if multiple rows are being refreshed simultaneously or nearly simultaneously). Additionally, or alternatively, the logic 722 may read the values in response to an activation-based refresh counter reaching an activation threshold. For example, the controller 704 can monitor activation commands issued per bank to the array 708. This activity can be monitored as a rolling accumulated activations (RAA) count. Each activation command increments the RAA count by 1 for the bank receiving the ACT command.

The logic 722 can then determine a quantity of row addresses between the at least a portion of the row address read from the register 712 and another row address that is included on a list of row addresses related to activation-based refresh operations (e.g., an address included in the SAR data 718) and adjust the list of row addresses related to the activation-based refresh operations, based on the quantity of row addresses and a threshold value (e.g., the threshold value 720).

For example, using the values read from the entries in the register 712, the SAR data 718, and the threshold value 720, the logic 722 can determine how many row addresses are between the row represented by the values read from the register 712 and another row address in the SAR data 718 (e.g., the row address currently "first" or "most likely affected" or "most important" on a list of SARs). Once the quantity of rows between the addresses is determined, the logic 722 can adjust the SAR data 718, based on the quantity between the address and the threshold value 720. In this way, the logic 722 can determine whether an address in the SAR data 718 should be prioritized for refresh operations and refresh the row before it would be refreshed according to a standard refresh schedule. In other cases, the logic 722 can determine that the standard refresh schedule will be adequate to account for the effects of any suspected usage-based disturb.

Consider FIG. 7-3, which illustrates a flow diagram for an example process that can be used to implement aspects of adaptive memory registers. In this example, assume that the SAR data 718 includes "i" addresses and that "k" represents the threshold value 720. The logic 722 reads the memory register 712 to determine the next address to be refreshed, $ADDR_{RC}$. The logic 722 also accesses the SAR data 718 to determine whether i is greater than zero. If i is not greater than zero (e.g., when the SAR data 718 does not include any addresses), the memory system 700 continues to manage refresh operations normally. If i is greater than zero (e.g., the SAR data 718 includes at least one address, $SAR_i$, where i=1 to N), the logic 722 compares the SAR data 718 (e.g. each value $SAR_i$, $SAR_1$ through $SAR_N$) with the $ADDR_{RC}$ value.

When $SAR_i$ (e.g., an address from the SAR data 718) is not greater than the address $ADDR_{RC}$, the memory system 700 continues to manage refresh operations normally. When $SAR_i$ is greater than the address $ADDR_{RC}$, the logic 722 compares the difference between the two addresses (e.g., $SAR_i$-$ADDR_{RC}$, which is the quantity of row address between $ADDR_{RC}$ and $SAR_i$) to "k" (the threshold value 720). If the difference is within the threshold value 720, that is, when $SAR_i$-$ADDR_{RC}$ is less than or equal to ($<=$) k, then SAR is relatively close to being refreshed and the logic 722 can remove $SAR_i$ from the list of at-risk addresses, the SAR data 718. If the difference exceeds the threshold value 720, then $SAR_i$ may be at risk of being affected by the usage-based disturb, and the logic 722 can retain $SAR_i$ in the SAR data 718 and/or reorder the SAR data 718. For example, by repeating this comparison process for each of the i addresses, $SAR_i$, the logic 722 can prioritize the most "at risk" SARs and reorder the SAR data 718. In some cases, the prioritizing reorder can be based on a quantity of activations/refreshes (e.g., of the usage-based disturb) and/or the distance $SAR_i\text{-}ADDR_{RC}$.

More specifically, consider an example in which k=10, $ADDR_{RC}$=1235, and i=4 ($SAR_1$=1239, $SAR_2$=1241, $SAR_3$=1251, and $SAR_4$=1259). Thus, i is greater than zero and each $SAR_i$ is greater than $ADDR_{RC}$. Further, the differences $SAR_i\text{-}ADDR_{RC}$ are 1239−1235=4, 1241−1235=6, 1251−1235=16, and 1259−1235=24. For $SAR_1$ and $SAR_2$, the differences 4 and 6 are less than k (10). $SAR_1$ and $SAR_2$ are therefore determined to be "close" to being refreshed (e.g., within the defined threshold) and can be removed from the SAR data 718. In contrast, while $SAR_3$ and $SAR_4$ are still greater than $ADDR_{RC}$, the differences 16 and 24 for $SAR_3$ and $SAR_4$, are greater than k. $SAR_3$ and $SAR_4$ are therefore determined to remain at risk. As a result, the SAR data 718 is reprioritized so that i=2 ($SAR_3$ and $SAR_4$).

In some implementations, if the difference exceeds the threshold value 720, and $SAR_i$ may be at risk of being affected by the usage-based disturb, the logic 722 (or another component of the controller 704) can also or instead transmit a signal or command that can initiate activation-based refreshed operations for $SAR_i$ (e.g., transmit a refresh management command, such as RFMab or RFMpb, to refresh $SAR_i$).

The bus 706 can be any suitable bus or other interconnect that can be used to transmit signals and/or data between the memory device 702 and the controller 704. In some implementations, the bus may be realized as or with the interconnect 106, the interconnect 416, the bus 506, or the bus 606.

In some implementations, the example memory system 700 may be implemented as part of another device, such as the memory device 108 (e.g., with or as part of the memory 122), the memory module 302, the DRAM 410, or the memory system 500. Additionally or alternatively, the example memory system 500 may be implemented as part of a CXL device (e.g., a Type 1 CXL device, a Type 2 CXL device, or a Type 3 CXL device). For example, the memory system 700 can include or be coupled to an interface that can couple to a host device (e.g., the host device 104) via an interconnect, such as the interconnect 106. The memory system 700 can also include or be coupled to a link controller (e.g., the link controller 406) that can be coupled to the interface and communicate with the host device. In some implementations, the interconnect can be an interconnect that can comport with at least one Compute Express Link (CXL) standard and the link controller may be a CXL controller.

The described example memory system 700 can save power by avoiding "extra" refresh operations on SARs that are relatively close to being refreshed based on normal operations. For example, normal operations may have been paused to refresh $SAR_1$ through $SAR_4$, based on the SAR data 718. But when normal operations resume, $SAR_1$ and $SAR_2$ may be unnecessarily refreshed again, which consumes extra power and may require additional power distribution hardware to account for higher peak currents and/or longer periods of peak current. Further, the described system 700 can provide additional methods for mitigating adverse effects that can be caused by usage-based disturb.

Example Methods

Figure 8:
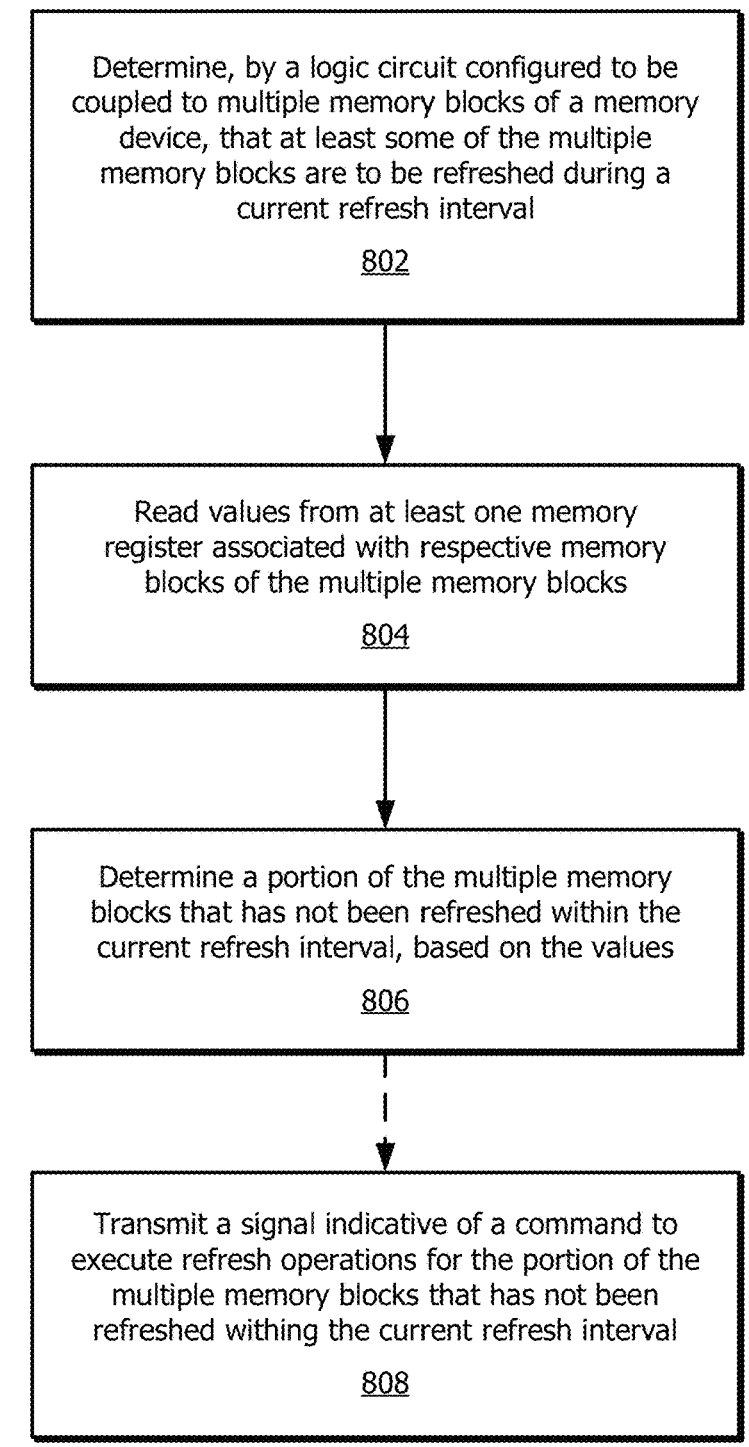

This section describes example methods with reference to the flow chart(s) and flow diagram(s) of FIGS. 8 and 9 for implementing aspects of adaptive memory registers. These descriptions may also refer to components, entities, and other aspects depicted in FIG. 1 through FIG. 7-3, to which reference is made only by way of example.

FIG. 8 illustrates a flow diagram for example processes 800 that implement aspects of adaptive memory registers. At block 802, a logic circuit that can be coupled to multiple memory blocks of a memory device (or component) determines that at least some of the multiple memory blocks are to be refreshed during a current refresh interval. For example, logic circuit can be the controller 604, which can include or have access to logic 622. The controller 604 can be connected, directly or indirectly, to the array 608 and the memory registers 610. The logic 622 can be used to determine that at least some of the memory blocks 616 are to be refreshed (e.g., during a current refresh interval or based on another criteria, such as exiting or entering a self-refresh state).

In some implementations, the memory blocks 616 can be memory banks of the memory array 608 (e.g., memory banks of a memory device, including a DRAM or other memory device that comports with a low-power double data rate (LPDDR) memory standard, such as LPPDR5, 5.x, 6, or another standard). Additionally or alternatively, the memory device and the logic circuit can be included in a device that operates in compliance with at least one Compute Express Link (CXL) standard (e.g., a Type 1 CXL device, a Type 2 CXL device, or a Type 3 CXL device).

At block 804, the logic circuit can read values from a memory register that is associated with respective memory blocks of the multiple memory blocks. For example, the logic 622 can read the values (e.g., values of bits) from the memory registers 610. In some implementations, the logic 622 reads the values in response to a determination that a timing-based refresh operation is required to conform to one or more memory operation standards (e.g., LPDDR5, 5.x, or 6) or that a refresh operation is required based on entry into, or exit from, a self-refresh (or other lower-power) mode.

In some implementations, the logic 622 can read the registers 610 prior to every refresh command that is scheduled to be issued (e.g. an interval-based command or a refresh command based on another criteria) and issue the refresh commands only to memory blocks 616 (e.g., memory banks of a DRAM) with corresponding register entries that indicate that the memory blocks 616 have not been refreshed within the current refresh interval (or that the memory blocks 616 remain unrefreshed after exiting the self-refresh state). In some implementations, as described, the memory registers 610 can be mode registers of the array 608 and the logic 622 can read the registers 610 using a mode register read command.

At block 806, the logic circuit can determine a portion of the multiple memory blocks that has not been refreshed within the current refresh interval, based on the values. For example, based on the values, the logic 622 can determine which memory blocks 616 of the array 608 have not been refreshed within the current refresh interval (or which memory blocks 616 remain unrefreshed after exiting the self-refresh state). In some implementations, the logic 622 can read the registers 610 and determine that memory blocks 616 corresponding to register entries with a value of "0" have not been refreshed within the current refresh interval. Accordingly, the logic 622 can determine that memory blocks 616 corresponding to register entries with a value of "1" have been refreshed within the current refresh interval (as described above, the values "0" and "1" can be reversed to instead indicate refreshed, and not refreshed, respectively). The registers 610 can be populated with data from a counter, such as the bank logic 612, that can track what rows have been refreshed for the respective memory blocks 616, as described above w/reference to FIG. 6-1.

Optionally, at block 808, the logic circuit can transmit a signal indicative of a command to execute refresh operations for the portion of the multiple memory blocks that has not been refreshed within the current refresh interval. For example, the logic 622 can transmit a signal indicative of a command (e.g., an auto-refresh command, an all-bank refresh command, a per-bank refresh command, or another command) to execute refresh operations for the portion of the multiple memory blocks 616 that has not been refreshed within the current refresh interval, based on the values. For example, the logic 622 can transmit the command to refresh the memory blocks 616 that have a value of "0" stored in the corresponding memory register 610.

FIG. 9 illustrates a flow diagram for other example processes 900 that implement aspects of adaptive memory registers. At block 902, a logic circuit that can be coupled to a memory device or component that includes multiple memory blocks reads at least a portion of an address associated with the multiple memory blocks from at least one memory register. The row address (or portion of the row address) can correspond to a refresh operation for a row of the multiple memory blocks. For example, the row address (or portion of the row address) that corresponds to the refresh operation can be a row currently being refreshed (or that is next to be refreshed, or that was most recently refreshed), as described with reference to FIG. 7-1. In some implementations, the multiple memory blocks can be multiple memory banks of a memory component (e.g., a DRAM or LPDDR device).

For example, the logic circuit can be the controller 704, which can include or have access to logic 722. The logic 722 can be coupled, directly or indirectly, to the array 708 and the memory registers 712. The logic 722 can read values (e.g., values of bits) from the memory register 712. In some implementations, the logic 722 can read the values from the memory register 712 using a mode register read command. The values can represent at least a portion of an address of the memory array 708 that corresponds to a refresh operation for a row of the memory array 708. For instance, the portion of the address can be a partial row address that corresponds to one or more rows of the array 708 (e.g., bits that represent a single address or multiple addresses if multiple rows are being refreshed simultaneously or nearly simultaneously).

In some implementations, the memory device (e.g., the array 708) may comport with at least one low-power double data rate (LPDDR) memory standard. Additionally or alternatively, the logic circuit and the memory device may be included in a device that operates in compliance with at least one Compute Express Link (CXL) standard.

Additionally, or alternatively, the logic 722 may read the values in response to an activation-based refresh counter reaching an activation threshold. For example, the controller 704 can monitor activation commands issued per bank to the array 708. This activity can be monitored as a rolling accumulated activations (RAA) count. Each activation command increments the RAA count by 1 for the bank receiving the ACT command. The activation threshold may be fixed or selectable and can be set by a manufacturer, vendor, customer, or user, based on various factors (e.g., technical limitations or specifications, desired performance parameters, cost considerations).

At block 904, the logic circuit determines a quantity of row addresses between the at least a portion of the address and another row address that is included on a list of row addresses related to activation-based refresh operations. For example, the logic 722 can determine a quantity of row addresses between the row address (or portion of the row address) that was read from the register 712 and another row address that is included on a list of row addresses related to activation-based refresh operations (e.g., an address included in the SAR data 718). As described with reference to FIG. 7-1, activation-based refresh operations can include refresh operations that are based on an amount of activation commands issued to the multiple memory blocks exceeding a threshold quantity. Example processes for performing this determination are described with respect to FIGS. 7-1 through 7-3.

At block 906, the logic circuit adjusts the list of row addresses related to the activation-based refresh operations based on the quantity and a threshold value. For example, the logic 722 can adjust the SAR data 718, based on the quantity between the address and the threshold value 720. In this way, the logic 722 can determine whether an address in the SAR data 718 should be prioritized for refresh operations and refresh the row before it would be refreshed according a standard refresh schedule. In other cases, the logic 722 can determine that the standard refresh schedule will be adequate to account for the effects of any suspected usage-based disturb.

The logic circuit can adjust the list of row addresses in any of a variety of ways. For example, the adjustment can include removing the other row address from the list, based on a determination that the quantity is less than the threshold value (e.g., removing an address from the SAR data 718 based on a determination that the SAR address is within the threshold value 720 of the address that corresponds to the refresh operation). In another example, the adjustment can include retaining the other row address on the list, based on a determination that the quantity is greater than the threshold value (e.g., retaining the address in the SAR data 718 based on a determination that SAR address is outside the threshold value 720 of the address that corresponds to the refresh operation). In other words, the logic 722 can determine whether an address in the SAR data 718 should be prioritized for refresh operations and refresh the row before it would be refreshed according to a standard refresh schedule (e.g., retain), or that the standard refresh schedule will be adequate to account for the effects of any suspected usage-based disturbance (e.g., remove).

In some cases, when the logic circuit determines that the quantity is greater than the threshold value, the logic circuit can transmit a signal indicative of a command to perform an activation-based refresh operation for the other row address. For example, if the difference exceeds the threshold value 720, the SAR address may be at risk of being affected by the usage-based disturb, and the logic 722 can transmit a signal or command that can initiate activation-based refreshed operations for the SAR, such as a refresh management command (e.g., RFMab or RFMpb) to refresh the SAR.

In some implementations, the described method 900 can be performed by another entity, such as the memory device 702. For example, the controller 704 can write the SAR data 718 to the memory device 702 (e.g., to available entries of the memory registers 712) and the logic circuitry 714 can read the relevant memory registers 712 and the refresh counter 710. The logic circuitry 714 can then perform the remaining operations of the method 900.

Further, the described method 900 may be performed when the memory array is in lower-power mode, such as a self-refresh mode. For example, the logic 722 can periodically read the memory registers 712 while the array 708 is in the lower-power mode and when the array 708 exits the lower-power mode, the logic 722 can determine a quantity of row addresses between the at least a portion of the address and another row address that is included in the SAR data 718 and perform the rest of the method 900.

The methods 800 and/or 900 can be used to reduce peak power consumption at the bank level during refresh operations, which can make improve refresh timing and memory retention. Additionally, reducing the peak current can reduce material costs by reducing the amount of metal layers and other components in the local power distribution network (PDN). Reducing the peak current at the bank level can also reduce the system-level peak current, making system-level PDN design less complex.

For example, the method 800 can enable a reduced number of refresh operations by enabling the controller to determine the banks that have already been refreshed, which can reduce the number of unnecessary refresh operations (e.g., "all-bank" refresh operations that would have been executed if the controller could not determine which banks were already refreshed). As refresh operations are power-intensive, reducing the number of operations can save power.

The method 900 can enable the system to reduce potentially duplicative refresh operations by prioritizing activation-based refresh operations to avoid refreshing rows in a special operation that are on the regular refresh schedule already. Further, the method 900 can provide additional tools for addressing adverse effects from usage-based disturb events, as described above.

For the flow chart(s) and flow diagram(s) described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses, components, or other aspects shown in FIGS. 1 to 6, the components or aspects of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations for adaptive memory registers have been described in language specific to certain features and/or methods, the subject of the appended claims is not necessarily limited to the specific features or methods described. Rather, the specific features and methods are disclosed as example implementations for adaptive memory registers.

What is claimed is:

1. An apparatus comprising:
 a memory array;
 a refresh counter configured to store at least a portion of an address indicative of a refresh operation for a row of the memory array;
 at least one memory register; and
 logic configured to:
  access the refresh counter;
  write values to respective entries of the at least one memory register, the values representing the at least a portion of the address; and
  write other values to respective entries of the at least one memory register, the other values representing at least a portion of another address indicative of another refresh operation for another row of the memory array, based on a determination that the refresh counter has incremented.

2. The apparatus of claim 1, wherein:
 the at least a portion of the address corresponds to a row of the memory array;
 that apparatus comprises a memory device; and
 the memory device comprises the memory array, the refresh counter, the at least one memory register, and the logic.

3. The apparatus of claim 1, wherein the logic is further configured to write the values that represent the at least a portion of the address before the refresh counter takes on another value.

4. The apparatus of claim 1, wherein the at least a portion of the address corresponds to a row for which the refresh operation was most recently completed.

5. The apparatus of claim 1, wherein the at least a portion of the address corresponds to a row for which a next refresh operation will be performed.

6. The apparatus of claim 1, wherein the at least a portion of the address corresponds to a row for which the refresh operation is in-progress.

7. The apparatus of claim 1, wherein the at least one memory register comprises at least a portion of a mode register.

8. The apparatus of claim 1, wherein the at least one memory register is readable by other logic coupled to the apparatus.

9. A method comprising:
 reading from at least one memory register, by a logic circuit configured to be coupled to a memory device that includes multiple memory blocks, at least a portion of an address associated with the multiple memory blocks, the at least a portion of the address corresponding to a refresh operation for a row of the multiple memory blocks;
 determining a quantity of row addresses between the at least a portion of the address and another row address included on a list of row addresses related to activation-based refresh operations; and adjusting the list of row addresses related to the activation-based refresh operations based on the quantity and a threshold value.

10. The method of claim 9, further comprising removing the other row address from the list, based on a determination that the quantity is less than the threshold value.

11. The method of claim 9, further comprising retaining the other row address on the list, based on a determination that the quantity is greater than the threshold value.

12. The method of claim 9, further comprising transmitting a signal indicative of a command to perform an activation-based refresh operation for the other row address, based on a determination that the quantity is greater than the threshold value.

13. The method of claim 9, further comprising reading the at least a portion of the address using a mode register read command.

14. The method of claim 9, wherein the at least a portion of the address associated with the multiple memory blocks comprises a partial row address that corresponds to at least one row of the multiple memory blocks.

15. The method of claim 9, wherein the multiple memory blocks comprise multiple memory banks of a memory component.

16. The method of claim 15, wherein the memory component comports with at least one low-power double data rate (LPDDR) memory standard.

17. The method of claim 9, wherein activation-based refresh operations comprise refresh operations that are based on an amount of activation commands issued to the multiple memory blocks exceeding a threshold quantity.

18. The method of claim 9, further comprising:
reading, by the logic circuit, the at least a portion of the address associated with the multiple memory blocks from the at least one memory register in response to an activation-based refresh counter reaching an activation threshold.

19. The method of claim 9, wherein the logic circuit and the memory device are included in a device that operates in compliance with at least one Compute Express Link (CXL) standard.

20. An apparatus comprising:
logic configured to be coupled to at least one memory array, the logic configured to:
read, from at least one memory register associated with the memory array, values that represent at least a portion of a row address of the memory array, the at least a portion of the row address corresponding to a refresh operation for a row of the memory array;
determine a quantity of row addresses between the at least a portion of the row address and another row address included on a list of row addresses related to activation-based refresh operations; and
adjust the list of row addresses related to the activation-based refresh operations, based on the quantity and a threshold value.

21. The apparatus of claim 20, wherein the logic is further configured to remove the other row address from the list, based on a determination that the quantity is less than the threshold value.

22. The apparatus of claim 20, wherein the logic is further configured to retain the other row address on the list, based on a determination that the quantity is greater than the threshold value.

23. The apparatus of claim 20, wherein the logic is further configured to transmit a signal indicative of a command to perform an activation-based refresh operation for the other row address, based on a determination that the quantity is greater than the threshold value.

24. The apparatus of claim 20, wherein the at least one memory register comprises at least a portion of a mode register.

25. The apparatus of claim 20, wherein the logic is further configured to read the values from the memory register using a mode register read command.

26. The apparatus of claim 20, wherein the memory array comports with at least one low-power double data rate (LPDDR) memory standard.

27. The apparatus of claim 20, further comprising:
the at least one memory array;
an interface configured to be coupled to a host device via an interconnect; and
a link controller coupled to the interface, the link controller configured to communicate with the host device.

28. The apparatus of claim 27, wherein the interconnect is configured to comport with at least one Compute Express Link (CXL) standard.

29. The apparatus of claim 27, wherein the link controller comprises a Compute Express Link (CXL) controller.

30. The apparatus of claim 27, wherein the apparatus comprises a Compute Express Link (CXL) device.

31. The apparatus of claim 20, wherein the logic is further configured to read the values that represent at least a portion of the address associated with the memory array in response to an activation-based refresh counter reaching an activation threshold.

32. An apparatus, comprising:
a memory array including multiple memory blocks;
at least one memory register; and
logic circuitry configured to:
determine which memory blocks of the multiple memory blocks have been refreshed within a current refresh interval; and
write values to respective entries of the at least one memory register associated with respective memory blocks of the multiple memory blocks, the values indicative of whether the respective memory blocks have been refreshed within the current refresh interval.

33. The apparatus of claim 32, wherein the logic circuitry is further configured to determine that a portion of the multiple memory blocks has been refreshed within the current refresh interval, and wherein the values indicate the respective memory blocks that have been refreshed within the current refresh interval.

34. The apparatus of claim 32, wherein the logic circuitry is further configured to determine that a portion of the multiple memory blocks has not been refreshed within the current refresh interval, and wherein the values indicate the respective memory blocks that have not been refreshed within the current refresh interval.

35. The apparatus of claim 32, wherein the logic circuitry is further configured to:
determine that all of the multiple memory blocks have been refreshed within the current refresh interval, and wherein the values indicate that, for another refresh interval after the current refresh interval, none of the multiple memory blocks have been refreshed.

36. The apparatus of claim 32, wherein the logic circuitry is further configured to write the values to the respective entries of the at least one memory register before the memory array receives a signal indicative of a command to execute refresh operations within a next refresh interval.

37. The apparatus of claim 32, wherein an entry of the respective entries comprises a bit stored in the at least one memory register.

38. The apparatus of claim 32, wherein the multiple memory blocks comprise multiple banks of the memory array.

39. The apparatus of claim 32, wherein the at least one memory register comprises at least a portion of a mode register.

40. The apparatus of claim 32, wherein the at least one memory register is readable by other logic coupled to the apparatus.

41. A method comprising:
   determining, by a logic circuit configured to be coupled to multiple memory blocks of a memory device, that at least some of the multiple memory blocks are to be refreshed during a current refresh interval;
   reading values from at least one memory register associated with respective memory blocks of the multiple memory blocks; and
   determining a portion of the multiple memory blocks that has not been refreshed within the current refresh interval, based on the values.

42. The method of claim 41, further comprising:
   transmitting a signal indicative of a command to execute refresh operations for the portion of the multiple memory blocks that has not been refreshed within the current refresh interval.

43. The method of claim 41, further comprising: reading the values from at least a portion of a mode register associated with respective memory blocks of the multiple memory blocks using a mode register read command.

44. The method of claim 41, wherein the multiple memory blocks comprise multiple memory banks of the memory device.

45. The method of claim 41, wherein the memory device comports with at least one low-power double data rate (LPDDR) memory standard.

46. The method of claim 41, further comprising:
   reading, by the logic circuit, the values from the at least one memory register associated with respective memory blocks of the multiple memory blocks in response to a determination that:
   a timing-based refresh operation is required to conform to one or more memory operations standards; or
   a refresh operation is required based on entry into, or exit from, a self-refresh mode.

47. The method of claim 41, wherein the logic circuit and the memory device are included in a device that operates in compliance with at least one Compute Express Link (CXL) standard.

48. An apparatus comprising:
   a logic circuit configured to be coupled to at least one memory array including multiple memory blocks, the logic circuit configured to:
      determine that at least some of the multiple memory blocks are to be refreshed during a current refresh interval;
      read values of bits stored in at least one memory register associated with respective blocks of the multiple memory blocks;
      determine a portion of the multiple memory blocks that has not been refreshed within the current refresh interval, based on the values of the bits; and
      transmit a signal indicative of a command to execute refresh operations for the portion of the multiple memory blocks that has not been refreshed within the current refresh interval.

49. The apparatus of claim 48, wherein the at least one memory register associated with respective memory blocks of the multiple memory blocks comprises at least a portion of a mode register associated with the respective memory blocks of the multiple memory blocks.

50. The apparatus of claim 48, wherein the at last one memory array comports with at least one low-power double data rate (LPDDR) memory standard.

51. The apparatus of claim 48, wherein the multiple memory blocks comprise multiple memory banks.

52. The apparatus of claim 48 further comprising:
   the at least one memory array;
   an interface configured to couple to a host device via an interconnect; and
   a link controller coupled to the interface, the link controller configured to communicate with the host device.

53. The apparatus of claim 52, wherein the interconnect is configured to comport with at least one Compute Express Link (CXL) standard.

54. The apparatus of claim 52, wherein the apparatus comprises a Compute Express Link (CXL) device.

55. The apparatus of claim 48, wherein the logic circuit is further configured to read the values of the bits in response to a determination that:
   a timing-based refresh operation is required to conform to one or more memory operations standards; or
   a refresh operation is required based on entry into, or exit from, a self-refresh mode.

* * * * *